United States Patent
Hendrich et al.

(10) Patent No.: US 10,658,152 B1
(45) Date of Patent: May 19, 2020

(54) METHOD FOR CONTROLLING A PARTICLE BEAM DEVICE AND PARTICLE BEAM DEVICE FOR CARRYING OUT THE METHOD

(71) Applicant: Carl Zeiss Microscopy GmbH, Jena (DE)

(72) Inventors: Christian Hendrich, Westhausen (DE); Josef Biberger, Wildenberg (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/151,524

(22) Filed: Oct. 4, 2018

(51) Int. Cl.
- *H01J 37/244* (2006.01)
- *H01J 37/22* (2006.01)
- *H01J 37/10* (2006.01)

(52) U.S. Cl.
CPC .......... *H01J 37/244* (2013.01); *H01J 37/10* (2013.01); *H01J 37/222* (2013.01)

(58) Field of Classification Search
CPC .......... H01J 37/10; H01J 37/153; H01J 37/22; H01J 37/222; H01J 37/24; H01J 37/244; H01J 37/302
See application file for complete search history.

(56) References Cited

U.S. PATENT DOCUMENTS

| | | | |
|---|---|---|---|
| 2004/0036031 A1 | 2/2004 | Rose et al. | |
| 2013/0271575 A1* | 10/2013 | Ullmann | H04N 13/279 348/46 |
| 2015/0069233 A1* | 3/2015 | Anderson | H01J 37/222 250/307 |
| 2015/0325408 A1* | 11/2015 | Yamashita | G06F 3/048 250/492.3 |

FOREIGN PATENT DOCUMENTS

WO  WO 02/067286 A2  8/2002

OTHER PUBLICATIONS

Tomomasa Sato, et al., "Hand-Eye System in Nano Manipulation World", IEEE International Conference on Robotics and Automation, 1995, 1995, seehttp://ieeexplore.ieee.org/document/525264/.

* cited by examiner

Primary Examiner — David E Smith
(74) Attorney, Agent, or Firm — Muirhead and Saturnelli, LLC

(57) ABSTRACT

A method for controlling a particle beam device for imaging, analyzing and/or processing an object, and a particle beam device for carrying out the method. The particle beam device may be an electron beam device and/or or an ion beam device. The method may include identifying at least one control parameter of a unit of the particle beam device using an eye tracker by tracking at least one eye of a user of the particle beam device, and changing the at least one control parameter of the unit of the particle beam device.

15 Claims, 9 Drawing Sheets

METHOD FOR CONTROLLING A PARTICLE BEAM DEVICE AND PARTICLE BEAM DEVICE FOR CARRYING OUT THE METHOD

TECHNICAL FIELD

The system described herein relates to a method for controlling a particle beam device for imaging, analyzing and/or processing an object. Moreover, the system described herein relates to a particle beam device for carrying out the method. For example, the particle beam device is an electron beam device and/or or an ion beam device.

BACKGROUND

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated using a beam generator and focused on an object to be examined using a beam guiding system. An objective lens is used for focusing purposes. The primary electron beam is guided over a surface of the object to be examined by way of a deflection device. This is also referred to as scanning. The area scanned by the primary electron beam is also referred to as scanning region. Here, the electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence. At least one radiation detector is used to detect the interaction radiation. Additionally or alternatively, electrons of the primary electron beam are used to ablate or modify the object, as explained further below.

In the case of a TEM, a primary electron beam is likewise generated using a beam generator and directed onto an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also may comprise a projection lens. Here, imaging may also take place in the scanning mode of a TEM. Such a TEM is often referred to as STEM. Additionally, provision may be made for detecting electrons scattered back at the object to be examined and/or secondary electrons emitted by the object to be examined using at least one further detector in order to image the object to be examined. Additionally or alternatively, in a TEM or STEM, electrons of the primary electron beam are used to ablate or modify the object, as explained further below.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated or material is applied onto the object during the processing. The ions are additionally or alternatively used for imaging.

Furthermore, the prior art has disclosed the practice of analyzing and/or processing an object in a particle beam device using, on one hand, electrons and, on the other hand, ions. By way of example, an electron beam column having the function of an SEM is arranged at the particle beam device. Additionally, an ion beam column, as explained above, is arranged at the particle beam device. The electron beam column with the SEM function serves, in particular, for examining further the processed or unprocessed object, but also for processing the object.

An object may be imaged with a high spatial resolution using an electron beam device. In particular, this is achieved by a very small diameter of the primary electron beam in the plane of the object. Further, the spatial resolution may improve the higher the electrons of the primary electron beam are initially accelerated in the electron beam device and decelerated to a desired energy (referred to as landing energy) at the end of the objective lens or in the region of the objective lens and the object. By way of example, the electrons of the primary electron beam are accelerated using an acceleration voltage of 2 kV to 30 kV and guided through an electron column of the electron beam device. The electrons of the primary electron beam are only decelerated to the desired landing energy, with which they are incident on the object, in the region between the objective lens and the object. By way of example, the landing energy of the electrons in the primary electron beam lies in the range between 10 eV and 30 keV.

There are objects which, on account of their structure, may only be expediently examined in an electron beam device if the electrons in the primary electron beam incident on these objects only have a low landing energy, for example an energy of less than 100 eV. Electrons with such low energy for example ensure that these specific objects are not destroyed and/or do not charge upon irradiation by electrons. Further, electrons at such low energy levels are particularly suitable for obtaining an image with a high surface sensitivity (i.e. a particularly good information content in respect of the topography and/or the material of the surface of the object) of an object to be examined.

When generating an image of the object, the user of an electron beam device always strives to obtain the ideal image quality of an image of the object which is required for examining an object. Expressed differently, a user always wishes to create an image of the object with such a high image quality that they are able to analyze the object to be examined well on account of the image and the image information contained therein. Here, the image quality may be determined by means of e.g. objective criteria. By way of example, the image quality of an image becomes better with increasing resolution in the image or with increasing contrast, for example depending on different materials. Alternatively, the image quality may be determined on the basis of subjective criteria. Here, a user determines individually as to whether or not an obtained image quality is sufficient. However, what may by all means occur in this case is that the image quality deemed sufficient by a first user is not considered sufficient by a second user. By way of example, the image quality of an image of an object may also be determined on the basis of the signal-to-noise ratio of the detector signal. The image quality is not sufficiently good in the case of a signal-to-noise ratio in the range from 0 to 5. By way of example, if the signal-to-noise ratio lies in the range from 20 to 40, this is referred to as a good signal-to-noise ratio (and hence also a good and sufficient image quality).

As mentioned above, it is also possible to detect interaction radiation, for example cathodoluminescence and X-ray radiation. When detecting interaction radiation, a user of an electron beam device may by all means seek to obtain the quality of the representation of the detection signals of a radiation detector based on the detected interaction radiation which is required for examining an object. By way of example, if X-ray radiation is detected by the radiation detector, the quality of the representation is determined e.g. by a good detection signal of the radiation detector. By way of example, the latter is embodied as an EDX detector. By way of example, the quality of the representation is then influenced by the count rate of the detected X-ray quanta on one hand and, on the other hand, by the full width at half maximum of the measured peaks in the X-ray spectrum. The quality of the representation of the detection signals increases with a higher count rate and a smaller full width at half maximum. By way of example, if cathodoluminescence is detected by a radiation detector, the quality of the representation may likewise be determined e.g. by a good detection signal of the radiation detector. By way of example, the quality of the representation is determined by the count rate of the detected photons of the cathodoluminescence. The count rate may be influenced by a suitable optical unit for light. Further, the primary electron beam may be set in such a way that the object emits as many photons as possible overall or as many photons as possible within a specific wavelength interval.

In order to obtain a good image quality of an image and/or a good representation of the detection signals based on the detected interaction radiation, which image and/or representation is/are generated using an electron beam device, a user of an electron beam device known from the prior art selects a desired landing energy with which the electrons are incident on the object. Moreover, a user selects an area of the object, which area is examined by scanning the primary electron beam over the area. For example, the area is selected by moving a sample stage holding the object within an object chamber of the electron beam device. Moreover, the user may select settings of further control parameters of at least one control unit. By way of example, the control parameters are physical variables, in particular a control current or a control voltage, but also e.g. the ratio of physical variables, in particular an amplification of physical variables. The values of the physical variables are adjustable at the control units or using the control units and these control and/or feed the units of the electron beam device in such a way that desired physical effects, for example, the generation of specific magnetic fields and/or electrostatic fields, are brought about.

The control parameters can be e.g. as follows.

A first control parameter of a first control unit sets the contrast in the generated image. In principle, the contrast is the brightness difference (i.e. the intensity difference) between the brightest pixel with a maximum luminance $L_{max}$ and the darkest pixel with a minimum luminance $L_{min}$ in an image. A smaller brightness difference between the two pixels means a low contrast. A larger brightness difference between the two pixels means a high contrast. By way of example, the contrast may be specified as Weber contrast or as Michelson contrast. Here, the following applies for the Weber contrast:

$$K_W = \frac{L_{max}}{L_{min}} - 1 \text{ with } 0 \leq K_W \leq \infty \qquad [1]$$

The following applies for the Michelson contrast:

$$K_M = \frac{L_{max} - L_{min}}{L_{max} + L_{min}} \text{ with } 0 \leq K_M \leq 1 \qquad [2]$$

The contrast which is substantially generated by the secondary electrons is determined by the topography of the surface of the object. On the other hand, the contrast which is substantially generated by the backscattered electrons is substantially determined by the material of the imaged object region. It is also referred to as material contrast. The material contrast depends on the mean atomic number of the imaged region of the object. By way of example, the contrast increases when a higher gain factor is set at an amplifier of the detector, wherein the detector is used to detect the secondary electrons and/or backscattered electrons. The amplifier amplifies the detection signal generated by the detector. Analogously, the contrast e.g. decreases when a smaller gain factor is set at the amplifier of the detector.

A second control parameter of a second control unit sets the brightness in the generated image. In principle, the brightness in an image is related to each pixel in the image. A first pixel with a higher brightness value than a second pixel appears brighter in the image than the second pixel. By way of example, the brightness is set by setting a gain factor of the detection signal of the detector. Here, the brightness of each pixel in the image is increased or lowered by an identical amount, for example also using a color table stored in a memory unit, with a specific brightness corresponding to a color included in the color table.

A third control parameter of a third control unit serves e.g. for actuating the objective lens, the latter being used to set the focusing of the primary electron beam onto the object.

A fourth control parameter for actuating a fourth control unit serves to center the primary electron beam in the objective lens. By way of example, the fourth control unit serves to set electrostatic and/or magnetic units of the electron beam device, by means of which the centering of the primary electron beam in the objective lens is set.

Moreover, the image quality of an image of the object and/or the quality of the representation of the detection signals based on the detected interaction radiation is/are influenced by a fifth control parameter of a fifth control unit for controlling and setting electrostatic and/or magnetic deflection units which are used in the electron beam device for a so-called "beam shift". As a result of this, it is possible to set the position of the scanning region and optionally displace the scanning region to a desired position. This may occur without the use of the sample stage (also referred to as object holder below), on which the object is arranged. By way of example, if the scanning region migrates out of the actual region of the object observed using the electron beam device on account of a change in the settings on the electron beam device, the primary electron beam is displaced in such a way as a result of translational movements in the case of a "beam shift" that the scanning region once again lies in the desired observed region.

A stigmator used in an electron beam device may also influence the image quality of the image of the object and/or the quality of the representation of the detection signals based on the detected interaction radiation. The stigmator—a magnetic and/or electrostatic multi-pole element—is used, in particular, for correcting an astigmatism. The stigmator may be set by a sixth control unit using a sixth control parameter.

The image quality of an image of the object and/or the quality of the representation of the detection signals based on the detected interaction radiation may, however, also be influenced by the position of a mechanically displaceable unit of the electron beam device. By way of example, the image quality is influenced by the position of an aperture which is used to shape and delimit the primary electron beam in the electron beam device.

The image quality of an image of the object and/or the quality of the representation of the detection signals based on the detected interaction radiation may further be influenced by the so-called scan rotation. This is a rotation of the scanning region in the plane of the scanning region about an optical axis of the electron beam device.

The image quality of an image of the object and/or the quality of the representation of the detection signals based on the detected interaction radiation may further be influenced by a beam blank system. The beam blank system is a deflection system deflecting a primary particle beam in such a way that the primary particle beam does not impinge the object.

Among many other parameters not mentioned here, all of the aforementioned control parameters influence imaging, analyzing and/or processing together. Therefore, an image of the object obtained by the particle beam device is based on several control parameters. Each control parameter may be controlled and set using its associated control unit. For example, at least one of the aforementioned control units is an interface controlled by a user, in particular a keyboard, a touchscreen and/or a slider. Moreover, at least one of the aforementioned control units may be used for controlling and setting at least two control parameters. For example, a single control unit may be used to control and set a first control parameter first. A second control parameter is controlled and set using the single control unit after the first control parameter is controlled and set.

It is known that an image of the object may be provided using different detectors, each detector being controlled by a different control unit using a different control parameter. In other words, the aforementioned image shown on the monitor may be provided using the signals of those different detectors. If a user wants to change the control parameter of a specific detector, the user has to manually identify the specific detector, for example by clicking on a specific area of the content shown in the monitor of the particle beam device and changing the value of the control parameter of this specific detector. However, on one hand, this is rather laborious. On the other hand, this is rather error-prone since a user often changes a control parameter of a detector which the user actually does not want to change since the user has identified a wrong detector.

It is therefore desirable to be able to provide a method and a particle beam device for carrying out the method, by means of which values of control parameters for control units for actuating components of a particle beam device are easy to change and/or by means of which a change of control parameters is not as error-prone as in the prior art.

SUMMARY OF THE INVENTION

A method according to the system described herein may be used for controlling and/or for operating a particle beam device for imaging, analyzing and/or processing an object. The aforementioned particle beam device may be an electron beam device and/or an ion beam device. The particle beam device may comprise a particle beam generator generating charged particles. The charged particles may be electrons and/or ions.

The method according to the system described herein may comprise the step of identifying at least one control parameter or control parameters of the particle beam device using an eye tracker by tracking at least one eye or both eyes of a user of the particle beam device. An eye tracker is a device for measuring eye positions and eye movement, in particular eye lens positions and eye lens movements. Eye trackers are in particular used as an input device for interaction with a computer. Eye tracking is a process of measuring either the point of gaze—in other words what the user of the particle beam device is looking at—or the motion of an eye, in particular a lens of an eye and/or an eye lid, relative to the head of the user and/or a display unit.

The method according to the system described herein also may comprise the step of changing the at least one control parameter or control parameters of a unit of the particle beam device. The at least one control parameter or control parameters may be physical variables, in particular a control current or a control voltage, but also e.g. the ratio of physical variables, in particular an amplification of physical variables. The values of the physical variables may be adjustable for example at control units or using the control units, and these control and/or feed units of the particle beam device associated to the control parameters in such a way that desired physical effects, for example, the generation of specific magnetic fields and/or electrostatic fields or a desired position of a sample stage are brought about.

The aforementioned unit of the particle beam device may be any adjustable and/or controllable component of the particle beam device such as, for example, a particle detector, a radiation detector, a movable sample stage on which the object may be arranged, a magnetic and/or electrostatic deflection device, a movable aperture unit as well as a micromanipulator for taking out a part of the object and for moving the part to another position. The system described herein is not restricted to the aforementioned units of the particle beam device. Rather, any component of the particle beam device suitable to be used as a unit of a particle beam device may be used.

The aforementioned unit of the particle beam device may be a particle beam apparatus. For example, the particle beam device may comprise several particle beam apparatuses, for example a first particle beam apparatus, a second particle beam apparatus and a third particle beam apparatus. In particular, each of the aforementioned particle beam apparatuses may be an SEM or an ion beam device. Therefore, each particle beam apparatus of the particle beam device may be controlled by the method according to the system described herein.

The aforementioned unit of the particle beam device may be a particle beam column. For example, the particle beam device may comprise a first particle beam column and a second particle beam column. The first particle beam column may be an SEM and the second particle beam column may be an ion beam device.

Therefore, each particle beam column of the particle beam device may be controlled by the method according to the system described herein.

The method according to the system described herein may provide for easy changing of values of control parameters associated to actuating units, in particular components, of the particle beam device. Since recognition and identification of the control parameter to be changed is effected by visual contact of the user and, therefore, by intentionally selecting the control parameter to be changed, the method according to the system described herein is not as error-prone as methods known from the prior art.

The method according to the system described herein may be used to change any suitable control parameter. Hereinafter, a few examples of suitable control parameters are discussed.

A first control parameter of a first control unit may set the contrast in the generated image. In principle, the contrast is the brightness difference (i.e. the intensity difference) between the brightest pixel with a maximum luminance $L_{max}$ and the darkest pixel with a minimum luminance $L_{min}$ in an image. A smaller brightness difference between the two pixels means a low contrast. A larger brightness difference between the two pixels means a high contrast. By way of example, the contrast may be specified as Weber contrast or as Michelson contrast. Here, the following applies for the Weber contrast:

$$K_W = \frac{L_{max}}{L_{min}} - 1 \text{ with } 0 \leq K_W \leq \infty \quad [1]$$

The following applies for the Michelson contrast:

$$K_M = \frac{L_{max} - L_{min}}{L_{max} + L_{min}} \text{ with } 0 \leq K_M \leq 1 \quad [2]$$

The contrast which is substantially generated by the secondary particles such as secondary electrons is determined by the topography of the surface of the object.

On the other hand, the contrast which is substantially generated by the backscattered particles, in particular backscattered electrons, is substantially determined by the material of the imaged object region. It is also referred to as material contrast. The material contrast depends on the mean atomic number of the imaged region of the object. By way of example, the contrast increases when a higher gain factor is set at an amplifier of a detector, wherein the detector is used to detect the secondary particles and/or backscattered particles. The amplifier amplifies the detection signal generated by the detector. Analogously, the contrast e.g. decreases when a smaller gain factor is set at the amplifier of the detector.

A second control parameter of a second control unit may set the brightness in the generated image. In principle, the brightness in an image is related to each pixel in the image. A first pixel with a higher brightness value than a second pixel appears brighter in the image than the second pixel. By way of example, the brightness is set by setting a gain factor of the detection signal of the detector. Here, the brightness of each pixel in the image is increased or lowered by an identical amount, for example also using a color table stored in a memory unit, with a specific brightness corresponding to a color included in the color table.

A third control parameter of a third control unit may serve e.g. for actuating an objective lens of the particle beam device, wherein the objective lens is used to set the focusing of a primary particle beam of the particle beam device onto the object.

A fourth control parameter for actuating a fourth control unit may serve to center the primary particle beam in the objective lens of the particle beam device. By way of example, the fourth control unit serves to set electrostatic and/or magnetic units of the particle beam device, by means of which the centering of the primary particle beam in the objective lens of the particle beam device is set.

Moreover, the image quality of an image of the object and/or the quality of the representation of the detection signals based on the detected interaction radiation may be influenced by a fifth control parameter of a fifth control unit for controlling and setting electrostatic and/or magnetic deflection units which may be used in the particle beam device for a so-called "beam shift". As a result of this, it is possible to set the position of the scanning region and optionally displace the scanning region to a desired position. This may occur without the use of the sample stage (also referred to as object holder below), on which the object is arranged. By way of example, if the scanning region migrates out of the actual region of the object observed using the particle beam device on account of a change in the settings on the particle beam device, the primary particle beam is displaced in such a way as a result of translational movements in the case of a "beam shift" that the scanning region once again lies in the desired observed region.

A stigmator may be used in a particle beam device, which may also influence the image quality of the image of the object and/or the quality of the representation of the detection signals based on the detected interaction radiation. The stigmator—a magnetic and/or electrostatic multi-pole element—may be used, in particular, for correcting an astigmatism. The stigmator may be set by a sixth control unit by means of a sixth control parameter.

The image quality of an image of the object and/or the quality of the representation of the detection signals based on the detected interaction radiation may, however, also be influenced by the position of a mechanically displaceable unit of the particle beam device. By way of example, the image quality is influenced by the position of an aperture unit which is used to shape and delimit the primary particle beam in the particle beam device. The aperture unit may be set by a seventh control unit by means of a seventh control parameter.

The image quality of an image of the object and/or the quality of the representation of the detection signals based on the detected interaction radiation may further be influenced by the so-called scan rotation. This is a rotation of the scanning region in the plane of the scanning region about an optical axis of the particle beam device. The scan rotation may be set by an eighth control unit by means of an eighth control parameter.

The image quality of an image of the object and/or the quality of the representation of the detection signals based on the detected interaction radiation may further be influenced by a beam blank system. As mentioned above, the beam blank system is a deflection system deflecting a primary particle beam in such a way that the primary particle beam does not impinge on the object. The beam blank system may be set by a ninth control unit by means of a ninth control parameter.

A multipole unit of higher order may be used for correcting lens aberrations of higher order. The multipole unit may be set by a tenth control unit by means of a tenth control parameter.

It is additionally or alternatively provided in an embodiment of the method according to the system described herein that the method further may comprise the step of providing a representation for example generated by the unit of the particle beam device. The representation may be, for example, at least one of the following: (i) an image of the object or of the unit of the particle beam device, wherein the image is, for example, generated by a particle detector or is a schematic drawing of the unit of the particle beam device, and (ii) analysis data generated by a radiation detector, for example an EDX detector or a WDX detector. Moreover, the method according to the system described herein may further comprise the step of identifying the representation using the eye tracker. When the representation is identified, the unit generating the representation or shown in the representation is identified and, therefore, the at least one control parameter which is associated to the representation and to the unit is also identified.

It is additionally or alternatively provided in a further embodiment of the method according to the system described herein that the method further may comprise the step of providing a representation as an image generated by the unit of the particle beam device. The image may be an image of the object to be imaged, analyzed and/or processed using the particle beam device. The unit of the particle beam device may be, for example, a particle detector, a radiation detector and/or an optical camera. Moreover, the method according to the system described herein may further comprise the step of identifying the representation in the form of the image using the eye tracker. When the image is identified, the unit of the particle beam device generating the image and, therefore, the at least one control parameter which is associated to the unit of the particle beam device also may be identified.

It is additionally or alternatively provided in another embodiment of the method according to the system described herein that the method further may comprise the step of providing a representation as an image of the unit of the particle beam device. For example, an image of the sample stage or a gas injection system (GIS) may be provided. The image may be generated by a particle detector, by a radiation detector and/or by an optical camera. The image may be an image which is embedded in a further image and/or which is shown together with a further image. Additionally or alternatively, the image may be a schematic drawing of the unit. Moreover, the method according to the system described herein may further comprise the step of identifying the representation in the form of the image using the eye tracker. When the image is identified, the unit of the particle beam device shown in the image is identified and, therefore, the at least one control parameter which is associated to the unit of the particle beam device is also identified.

It is additionally or alternatively provided in an embodiment of the method according to the system described herein that the method further may comprise the step of providing a representation as an image of the object arranged at the unit of the particle beam device. The unit of the particle beam device may be, for example, a sample stage and/or a sample holder. The image of the object may be generated by a particle detector, by a radiation detector and/or by an optical camera. Moreover, the method according to the system described herein may further comprise the step of identifying the representation in the form of the image using the eye tracker. When the image is identified, the unit of the particle beam device carrying the object is identified and, therefore, the at least one control parameter which is associated to this unit of the particle beam device is also identified.

It is additionally or alternatively provided in a further embodiment of the method according to the system described herein that the method may comprise at least one of the following steps: (i) using an ion beam device as the particle beam device, and (ii) using an electron beam device as the particle beam device. In particular, a particle beam device comprising several beam columns may be used for the system described herein. The several beam columns each may provide the same particles (for example electrons or ions) or different particles.

A further method according to the system described herein also may be used for controlling and/or for operating a particle beam device for imaging, analyzing and/or processing an object. The aforementioned particle beam device may be an electron beam device and/or an ion beam device. The particle beam device may comprise a particle beam generator generating charged particles. The charged particles may be electrons and/or ions.

The further method according to the system described herein may comprise the step of tracking at least one eye or both eyes of a user of the particle beam device using an eye tracker. As mentioned above, the eye tracker is a device for measuring eye positions and eye movement, in particular eye lens positions and eye lens movements. Eye tracking is a process of measuring either the point of gaze—in other words what the user of the particle beam device is looking at—or the motion of an eye, in particular a lens of an eye and/or an eye lid, relative to the head of the user and/or a display unit.

The further method according to the system described herein also may comprise the step of identifying at least one of: (i) a first unit of the particle beam device to which the at least one eye of the user is directed and (ii) a representation to which the at least one eye of the user is directed and which is, for example, shown on a display unit of the particle beam device, for example a monitor, wherein the representation is associated with a second unit of the particle beam device. The representation is, for example, a schematic drawing of the second unit or is based on detection signals of a detector. The aforementioned first unit and second unit of the particle beam device may be any adjustable and/or controllable components of the particle beam device such as, for example, a particle detector, a radiation detector, a movable sample stage on which the object may be arranged, a magnetic and/or electrostatic deflection device, a movable aperture unit as well as a micromanipulator for taking out a part of the object and for moving the part to another position. The system described herein is not restricted to the aforementioned units of the particle beam device. Rather, any component of the particle beam device suitable to be used as a unit of the particle beam device may be used.

The further method according to the system described herein also may comprise the step of selecting the first unit of the particle beam device if the first unit of the particle beam device has been identified or selecting the second unit of the particle beam device if the representation, for example shown on the display unit, has been identified. Moreover, the further method according to the system described herein also may comprise the step of activating the first unit of the particle beam device to a first change mode if the first unit of the particle beam device has been selected and changing at least one first control parameter of the first unit of the particle beam device, or the step of activating the second unit of the particle beam device to a second change mode if the second unit of the particle beam device has been selected and changing at least one second control parameter of the second unit of the particle beam device.

The first control parameter and the second control parameter may be physical variables, in particular a control current or a control voltage, but also e.g. the ratio of physical variables, in particular an amplification of physical variables. The values of the physical variables may be adjustable for example at control units or using the control units, and these control and/or feed units of the particle beam device associated to the first and second control parameters in such a way that desired physical effects, for example, the generation of specific magnetic fields and/or electrostatic fields, or a desired position of a sample stage are brought about.

The further method according to the system described herein may be used to change any suitable first control parameter and second control parameter. A few examples of suitable control parameters have been discussed above. We refer to the above mentioned discussion which also applies to the first control parameter and the second control parameter.

The aforementioned first and second units of the particle beam device may each be a particle beam apparatus. For example, the particle beam device may comprise several particle beam apparatuses, for example a first particle beam apparatus and a second particle beam apparatus. In particular, each of the aforementioned particle beam apparatus may be an SEM or an ion beam device. Therefore, each particle beam apparatus of the particle beam device may be controlled by the method according to the system described herein.

The aforementioned first and second units of the particle beam device may be a particle beam column. For example, the particle beam device may comprise a first particle beam column and a second particle beam column. The first particle beam column may be an SEM and the second particle beam column may be an ion beam device. Therefore, each particle beam column of the particle beam device may be controlled by the method according to the system described herein.

The further method according to the system described herein also may provide for easy changing of values of control parameters associated to actuating units, for example components of the particle beam device. Since recognition and identification of the control parameter to be changed is effected by visual contact of the user and, therefore, by intentionally selecting the control parameter to be changed, the further method according to the system described herein is not as error-prone as methods known from the prior art.

It is additionally or alternatively provided in an embodiment of the further method according to the system described herein that the further method also may comprise the step of providing the representation as data using signals of the second unit of the particle beam device, wherein the second unit of the particle beam device is a detector of the particle beam device. The representation may be, for example, at least one of the following: (i) an image of the object or of the first unit of the particle beam device generated by a particle detector, and (ii) analysis data generated by a radiation detector, for example an EDX detector or a WDX detector.

It is additionally or alternatively provided in a further embodiment of the further method according to the system described herein that the method further comprises the step of providing the representation as an image generated by the second unit of the particle beam device, wherein the second unit of the particle beam device is a detector of the particle beam device. The image may be an image of the object to be imaged, analyzed and/or processed using the particle beam device. The second unit of the particle beam device may be, for example, a particle detector, a radiation detector and/or an optical camera.

It is additionally or alternatively provided in another embodiment of the further method according to the system described herein that the method further comprises the step of providing the representation as an image of the second unit of the particle beam device. For example, an image of the sample stage or a gas injection system (GIS) may be provided. The image may be generated by a particle detector, by a radiation detector and/or by an optical camera. The image may be an image which is embedded in a further image and/or which is shown together with a further image. Additionally or alternatively, the image may be a schematic drawing of the second unit.

It is additionally or alternatively provided in an embodiment of the further method according to the system described herein that the further method further comprises the step of providing the representation as an image of the object arranged at the second unit of the particle beam device. The second unit of the particle beam device may be, for example, a sample stage and/or a sample holder. The image of the object may be generated by a particle detector, by a radiation detector and/or by an optical camera.

It is additionally or alternatively provided in a further embodiment of the further method according to the system described herein that the further method comprises at least one of the following steps: (i) using an ion beam device as the particle beam device, and (ii) using an electron beam device as the particle beam device. In particular, a particle beam device comprising several beam columns may be used for the system described herein. The several beam columns each may provide the same particles (for example electrons or ions) or different particles.

The system described herein also refers to a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

The system described herein also may include to a particle beam device for imaging, analyzing and/or processing an object. The particle beam device according to the system described herein may comprise at least one particle beam generator for generating a primary particle beam comprising charged particles. The charged particles may be, for example, electrons or ions. Moreover, the particle beam device according to the system described herein also may have at least one objective lens for focusing the primary particle beam onto the object. Furthermore, the particle beam device according to the system described herein may have at least one detector for detecting interaction particles and/or interaction radiation, the interaction particles and interaction radiation being generated when the primary particle beam impinges on the object. The interaction particles may be secondary particles and/or backscattered particles, in particular secondary electrons and backscattered electrons. The interaction radiation may be X-rays and/or cathodoluminescence light. Moreover, the particle beam device according to the system described herein also may comprise at least one processor into which a computer program product as mentioned above is loaded.

It is additionally or alternatively provided in an embodiment of the particle beam device according to the system described herein that the particle beam generator is a first particle beam generator for generating a first primary particle beam comprising first charged particles. The objective lens is a first objective lens for focusing the first primary particle beam onto the object. The particle beam device according to the embodiment of the system described herein further may comprise a second particle beam generator for generating a second primary particle beam comprising second charged particles and a second objective lens for focusing the second primary particle beam onto the object. The second charged particles may be electrons and/or ions.

It is additionally or alternatively provided in a further embodiment of the particle beam device that the particle beam device is at least one of the following: an electron beam device and an ion beam device. In particular, the particle beam device may be both, an electron beam device and an ion beam device. The electron beam device and the ion beam device may be arranged at an angle to each other, for example an angle in the range of 45° to 90°, wherein the boundaries are included in this range. In particular, the electron beam device and the ion beam device may be arranged at an angle of 54° to each other. However, the system described herein is not restricted to the above-mentioned angles. Rather, any angle between the electron beam device and the ion beam device which is suitable for the system described herein may be used.

BRIEF DESCRIPTION OF THE DRAWINGS

Embodiments of the system described herein will be explained in more detail in the following text with reference to the figures, in which.

DESCRIPTION OF VARIOUS EMBODIMENTS

The system described herein is now explained in more detail by means of a particle beam device in the form of an SEM and in the form of a combination device, which has an electron beam column and an ion beam column. Reference is explicitly made to the fact that the system described herein may be used in any particle beam device, in particular in every electron beam device and/or in every ion beam device.

Figure 1:
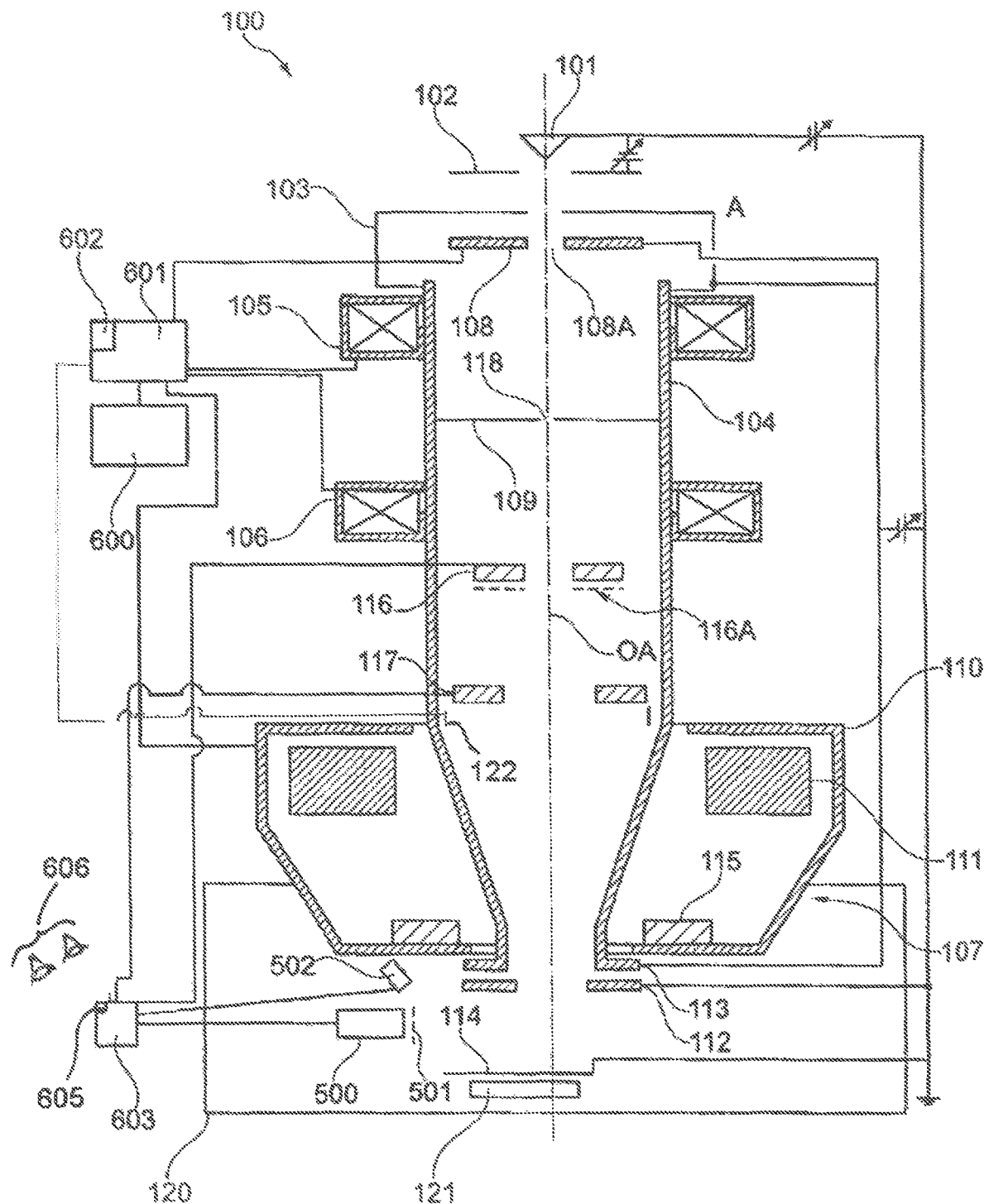
FIG. 1 shows a first embodiment of a particle beam device according to the system described herein.

FIG. 1 shows a schematic illustration of an SEM 100. The SEM 100 may comprise a first beam generator in the form of an electron source 101, which is embodied as a cathode. Further, the SEM 100 may be provided with an extraction electrode 102 and with an anode 103, which is arranged on one end of a beam guiding tube 104 of the SEM 100. By way of example, the electron source 101 is embodied as a thermal field emitter. However, the system described herein is not restricted to such an electron source 101. Rather, any electron source may be used for the system described herein.

Electrons emerging from the electron source 101 form a primary electron beam. The electrons are accelerated to the anode potential due to a potential difference between the electron source 101 and the anode 103. By way of example, in the illustrative embodiment depicted here, the anode potential is 1 kV to 20 kV, e.g. 5 kV to 15 kV, in particular 8 kV, in relation to a ground potential of a housing of a sample chamber 120. However, alternatively it can be at ground potential.

A condenser lens 105 is arranged at the beam guiding tube 104. Further, provision is made of a stigmator 106. Here, proceeding from the electron source 101 as viewed in the direction of a first objective lens 107, the condenser lens 105 is arranged first, followed by the stigmator 106. It should be noted that further embodiments of the SEM 100 may also have more than one condenser lens. A first aperture unit 108, which may also be embodied as a pressure stage aperture in some embodiments, is arranged between the anode 103 and the condenser lens 105. Together with the anode 103 and the beam guiding tube 104, the first aperture unit 108 is at a high voltage potential, namely the potential of the anode 103, or it is connected to ground. The first aperture unit 108 may have numerous first apertures 108A, one of which is depicted in FIG. 1. Two first apertures 108A may be present, for example. Each one of the numerous first apertures 108A may have a different aperture diameter. Using an adjustment mechanism (not depicted here), it is possible to set a desired first aperture 108A on an optical axis OA of the SEM 100 and center the latter, i.e. obtain an alignment in respect of the optical axis OA that is as central as possible. It should be noted that, in further embodiments, the first aperture unit 108 may be provided with only a single aperture 108A. An adjustment mechanism for centering the first aperture unit 108 is likewise provided in this embodiment.

A stationary second aperture unit 109 is arranged between the condenser lens 105 and the stigmator 106. The second aperture unit 109 may be designed in a movable fashion as an alternative thereto.

The first objective lens 107 may comprise pole pieces 110, in which a centrally arranged bore is embodied along the optical axis OA. The beam guiding tube 104 is guided through this bore. Further, a coil 111 is arranged in the pole pieces 110.

An electrostatic retardation device is arranged in a lower region of the beam guiding tube 104. It may have a single electrode 112 and a tube electrode 113. The tube electrode 113 is arranged at one end of the beam guiding tube 104, which faces an object 114. Together with the beam guiding tube 104, the tube electrode 113 is at the potential of the anode 103, while the single electrode 112 and the object 114 are at a lower potential in relation to the potential of the anode 103. In the present case, this is the ground potential of the housing of the sample chamber 120. In this manner, the electrons of the primary electron beam may be decelerated to a desired energy which is required for examining the object 114. The desired energy is the examination energy. It is also referred to as landing energy.

The SEM 100 further may comprise a scanning device 115, by means of which the primary electron beam may be deflected and scanned over the object 114. Here, the electrons of the primary electron beam interact with the object 114. As a consequence of the interaction, interaction particles and/or interaction radiation emerge/emerges, which is/are detected. In particular, electrons are emitted from the surface of the object 114—the so-called secondary electrons—or electrons of the primary electron beam are scattered back—the so-called backscattered electrons—as interaction particles.

The object 114 and the single electrode 112 may also be at different potentials and potentials different than ground. It is thereby possible to set the location of the retardation of the primary electron beam in relation to the object 114. By way of example, if the retardation is carried out very near to the object 114, optical aberrations become smaller.

A detector arrangement comprising a first detector 116 and a second detector 117 is arranged in the beam guiding tube 104 for detecting the secondary electrons and/or the backscattered electrons. Here, the first detector 116 is arranged on the source-side along the optical axis OA, while the second detector 117 is arranged on the object-side along the optical axis OA in the beam guiding tube 104. The first detector 116 and the second detector 117 may be arranged offset from one another in the direction of the optical axis OA of the SEM 100. Both the first detector 116 and the second detector 117 each may have a passage opening, through which the primary electron beam may pass. The first detector 116 and the second detector 117 may be approximately at the potential of the anode 103 and of the beam guiding tube 104. The optical axis OA of the SEM 100 extends through the respective passage openings.

The second detector 117 serves principally for detecting secondary electrons. Upon emerging from the object 114, the secondary electrons initially have a low kinetic energy and arbitrary directions of motion. By means of the strong extraction field emanating from the tube electrode 113, the secondary electrons are accelerated in the direction of the first objective lens 107. The secondary electrons enter the first objective lens 107 approximately parallel. The beam diameter of the beam of secondary electrons remains small in the first objective lens 107 as well. The first objective lens 107 then may have a strong effect on the secondary electrons and generates a comparatively short focus of the secondary electrons with sufficiently steep angles with respect to the optical axis OA, such that the secondary electrons diverge far apart from one another downstream of the focus and impinge on the second detector 117 on the active area thereof. By contrast, only a small proportion of electrons that are backscattered at the object 114—that is to say backscattered electrons—which have a relatively high kinetic energy in comparison with the secondary electrons upon emerging from the object 114, are detected by the second detector 117. The high kinetic energy and the angles of the backscattered electrons with respect to the optical axis OA upon emerging from the object 114 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with a retarding field grid 116A. The retarding field grid 116A is arranged at the side of the first detector 116 directed toward the object 114. With respect to the potential of the beam guiding tube 104, the retarding field grid 116A may have such a negative potential that only backscattered electrons with a high energy pass through the retarding field grid 116A to the first detector 116. Additionally or alternatively, the second detector 117 may have a further retarding field grid, which has an analogous embodiment to the aforementioned retarding field grid 116A of the first detector 116 and which has an analogous function.

The detection signals generated by the first detector 116 and the second detector 117 may be used to generate an image or images of the surface of the object 114. These may be displayed on a display unit 603 connected to the first detector 116 and the second detector 117 via a processing unit (not shown).

It should be noted that the apertures of the first aperture unit 108 and of the second aperture unit 109, as well as the passage openings of the first detector 116 and of the second detector 117 are depicted in an exaggerated fashion. The passage opening of the first detector 116 and of the second detector 117 may have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 is configured as a pinhole aperture in the illustrative embodiment depicted here and it may be provided with a second aperture 118 for the passage of the primary electron beam, wherein the second aperture 118 has an extent in the range from 5 μm to 500 μm, e.g. 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is embodied as a pressure stage aperture. It separates a first region, in which the electron source 101 is arranged and in which an ultra-high vacuum ($10^{-7}$ hPa to $10^{-12}$ hPa) prevails, from a second region, which has a high vacuum ($10^{-3}$ hPa to $10^{-7}$ hPa). The second region is the intermediate pressure region of the beam guiding tube 104, which leads to the sample chamber 120.

A further detector in the form of an analysis device 500, which is likewise connected to the display unit 603, is arranged in the sample chamber 120. The analysis device 500 may comprise a collector grid 501 for guiding the interaction particles onto the analysis device 500. A potential is applied to the collector grid 501 in such a way that interaction particles reach the analysis device 500.

The SEM 100 further may comprise a fourth detector 121, which is arranged in the sample chamber 120 and which is likewise connected to the display unit 603 (not shown in FIG. 1). More precisely, the fourth detector 121 is arranged behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined or—in the case of a sufficiently thin object 114—the electrons emitted in the direction of the fourth detector 121 by the object 114 are detected by the fourth detector 121.

A radiation detector 502 with which interaction radiation arising on account of an interaction between the primary electron beam and the object 114 is detected is also arranged in the sample chamber 120. By way of example, the interaction radiation is X-ray radiation or cathodoluminescence. The radiation detector 502 is likewise connected to the display unit 603.

The SEM 100 further may comprise a first deflection unit 122 which may be a magnetic and/or electrostatic deflection unit. The first deflection unit 122 is used for deflecting the primary electron beam. This will be explained further below.

The SEM 100 may comprise a processor 600. A computer program product with a program code controlling the SEM 100 is loaded into said processor. This is discussed in more detail further below. The processor 600 is connected to a control unit 601, said control unit 601 comprising a memory unit 602. The control unit 601 serves to actuate at least one unit of the SEM 100, for example, the first aperture unit 108, the condenser lens 105, the stigmator 106, the first detector 116, the second detector 117, the third detector 121, the analysis unit 500, the radiation detector 502, the first deflection unit 122 and/or the first objective lens 107. This is discussed in more detail further below. For reasons of clarity, FIG. 1 shows only some connecting lines from the control unit 601 to some of the aforementioned units.

The display unit 603 may comprise an eye tracker 605. The eye tracker 605 is used for tracking at least one eye or both eyes 606 of a user of the SEM 100. As mentioned above, the eye tracker 605 is a device for measuring eye positions and eye movement, in particular eye lens positions and eye lens movements. Eye tracking is a process of measuring either the point of gaze—in other words what the user of the SEM 100 is looking at—or the motion of the eyes 606, in particular a lens of an eye 606 and/or an eye lid, relative to the head of the user and/or the display unit 603.

Figure 1A:
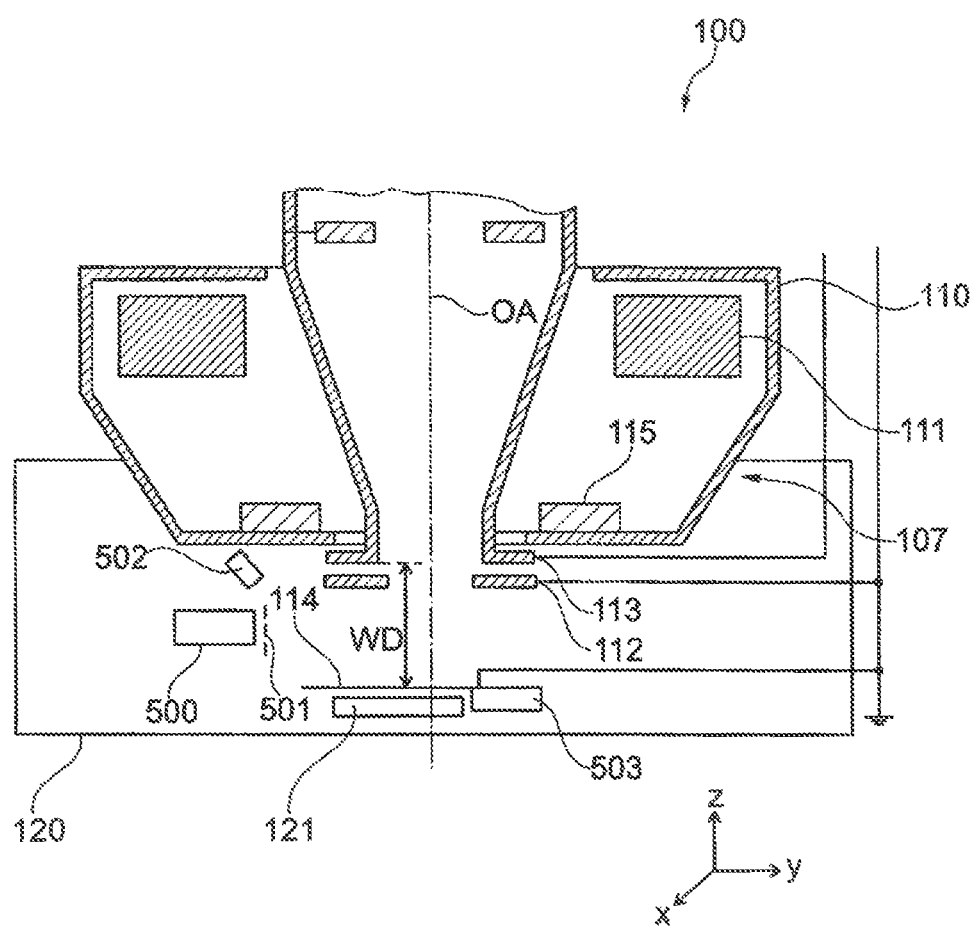
FIG. 1A shows a magnified illustration of a region of the particle beam device according to FIG. 1, according to an embodiment of the system described herein.

FIG. 1A shows a magnified illustration of the region of the sample chamber 120 of the SEM 100. FIG. 1A is based on FIG. 1. Like reference signs refer to like components. In contrast to FIG. 1, FIG. 1A shows a movable sample stage 503 (i.e. an object holder), the object 114 to be examined being arranged thereon. The sample stage 503 is movable in three directions arranged perpendicular to one another, namely in an x-direction, in a y-direction and in a z-direction. Additionally, the sample stage 503 may be rotated about a first axis of rotation and about a second axis of rotation arranged perpendicular to the first axis of rotation. It is possible to set the distance WD of the surface of the object 114 from the tube electrode 113 of the beam guiding tube 104 using a movement of the sample stage 503 in the z-direction, which extends parallel to the optical axis OA or corresponds to the latter. The tube electrode 113 forms the end of the beam guiding tube 104. The distance WD is also referred to as working distance. By way of example, it lies in the range from 0.3 mm to 20 mm or in the range from 0.5 mm to 12 mm. It should be noted that the aforementioned distance values should only be understood to be illustrative and not restrictive. Rather, other values for the distance may also be selected.

Figure 2:
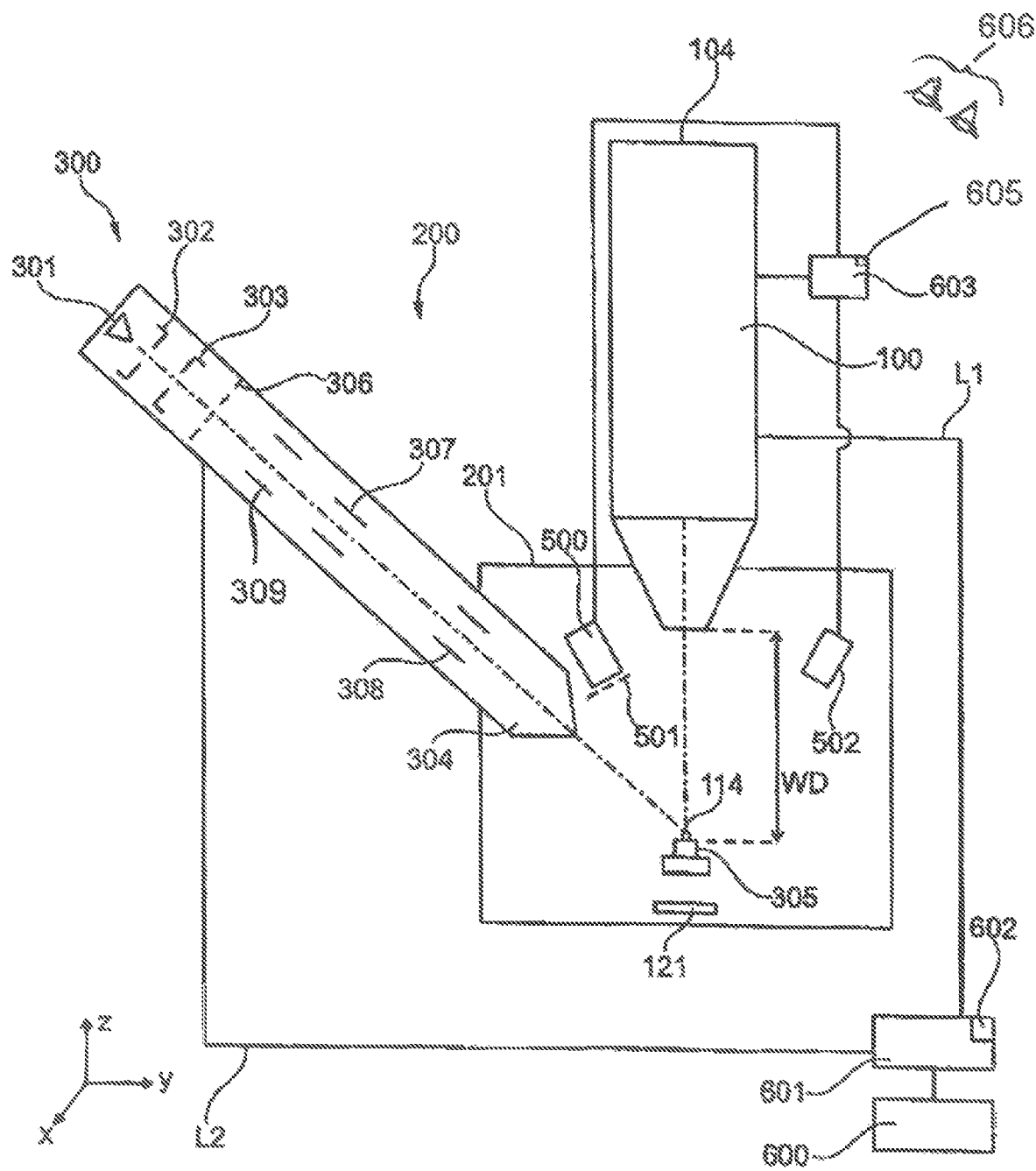
FIG. 2 shows a second embodiment of a particle beam device according to the system described herein.

FIG. 2 shows a particle beam device in the form of a combination device 200. The combination device 200 has two particle beam columns. On one hand, the combination device 200 may be provided with the SEM 100, as depicted in FIG. 1, but without the sample chamber 120. Rather, the SEM 100 is arranged at a sample chamber 201. The SEM 100 serves to generate a first primary particle beam, namely the primary electron beam described further above. On the other hand, the combination device 200 may be provided with an ion beam device 300, which is likewise arranged at the sample chamber 201.

The SEM 100 is arranged vertically in relation to the sample chamber 201. By contrast, the ion beam device 300 is arranged inclined by an angle of approximately 54° in relation to the SEM 100. It may have a second beam generator in the form of an ion beam generator 301. Ions, which form a second primary particle beam in the form of an ion beam, are generated by the ion beam generator 301. The ions may be accelerated using an extraction electrode 302, which is at a predeterminable potential. The second primary particle beam then reaches through ion optics of the ion beam device 300, wherein the ion optics may comprise an ion condenser lens 303 and a second objective lens 304. The second objective lens 304 ultimately generates a primary ion beam, which is focused on the object 114 arranged on a sample stage 305.

An adjustable aperture 306, a first electrode arrangement 307 and a second electrode arrangement 308 may be arranged above the objective lens 304 (i.e. in the direction of the ion beam generator 301), wherein the first electrode arrangement 307 and the second electrode arrangement 308 may be embodied as scanning electrodes. The second particle beam is scanned over the surface of the object 114 by means of the first electrode arrangement 307 and the second electrode arrangement 308, with the first electrode arrangement 307 acting in a first direction and the second electrode arrangement 308 acting in a second direction, which is counter to the first direction. Using this, scanning is carried out in e.g. an x-direction. The scanning in a y-direction perpendicular thereto is brought about by further electrodes (not depicted here), which may be rotated by 90°, at the first electrode arrangement 307 and at the second electrode arrangement 308.

The distances depicted in FIG. 2 between the individual units of the combination device 200 are depicted in an exaggerated fashion in order to better depict the individual units of the combination device 200.

An analysis device 500 comprising a collector grid 501 is arranged in the sample chamber 201 and said analysis device 500 detects interaction particles which arise on account of an interaction of the primary electron beam with the object 114 or on account of an interaction of the primary ion beam with the object 114. By way of example, the interaction particles are secondary electrons, backscattered electrons and/or secondary ions. The analysis device 500 is also connected to the display unit 603 via a processing unit (not shown) in this illustrative embodiment, said display unit 603 likewise being connected to the first detector 116, the second detector 117 and the third detector 121 of the SEM 100 via said processing unit.

A radiation detector 502 with which interaction radiation arising on account of an interaction between the primary electron beam and the object 114 is detected is also arranged in the sample chamber 201. By way of example, the interaction radiation is, once again, X-ray radiation or cathodoluminescence. The radiation detector 502 is likewise connected to the display unit 603.

The sample stage 305 is movable in three directions arranged perpendicular to one another, namely in an x-direction, in a y-direction and in a z-direction. Additionally, the sample stage 305 may be rotated about a first axis of rotation and about a second axis of rotation arranged perpendicular to the first axis of rotation. It is possible to set the distance WD of the surface of the object 114 from the beam guiding tube 104 of the SEM 100 using a movement of the sample stage 305 in the z-direction, which extends parallel to the optical axis OA of the SEM 100 or corresponds to the latter. This is the working distance. By way of example, it lies in the range from 0.3 mm to 20 mm or in the range from 0.5 mm to 12 mm, as in the case of the device described further above. The range limits are included in the predeterminable range. It should be noted that the aforementioned distance values should be understood to be only illustrative and not restrictive. Rather, other values for the distance may also be selected.

The ion beam device 300 further may comprise a second deflection unit 309 which may be a magnetic and/or electrostatic deflection unit. The second deflection unit 309 is used for deflecting the second primary particle beam in the form of the ion beam. This will be explained further below.

The combination device 200 likewise may comprise a processor 600. A computer program product with a program code controlling the SEM 100 and/or the ion beam device 300 is loaded into said processor. This is discussed in more detail further below. The processor 600 is also connected to the control unit 601 in this illustrative embodiment, said control unit comprising the memory unit 602. The control unit 601 serves to actuate at least one unit of the combination device 200, for example one of the units, mentioned above, of the SEM 100 or, for example, the condenser lens 303, the second objective lens 304, the sample stage 305, the radiation detector 502, the adjustable aperture 306 and/or the second deflection unit 309 of the ion beam device 300. The control unit 601 is connected to at least one of the units. This is depicted schematically by a first line L1 and a second line L2. Therefore, the control unit 601 is used for controlling both the SEM 100 and the ion beam device 300. Alternatively, separate control units may be used for controlling the SEM 100 and the ion beam device 300, for example a first control unit for controlling the SEM 100 and a second control unit for controlling the ion beam device 300.

The display unit 603 of the embodiment according to FIG. 2 also may comprise an eye tracker 605. As mentioned above, the eye tracker 605 is used for tracking at least one eye or both eyes 606 of a user of the combination device 200.

Figure 3:
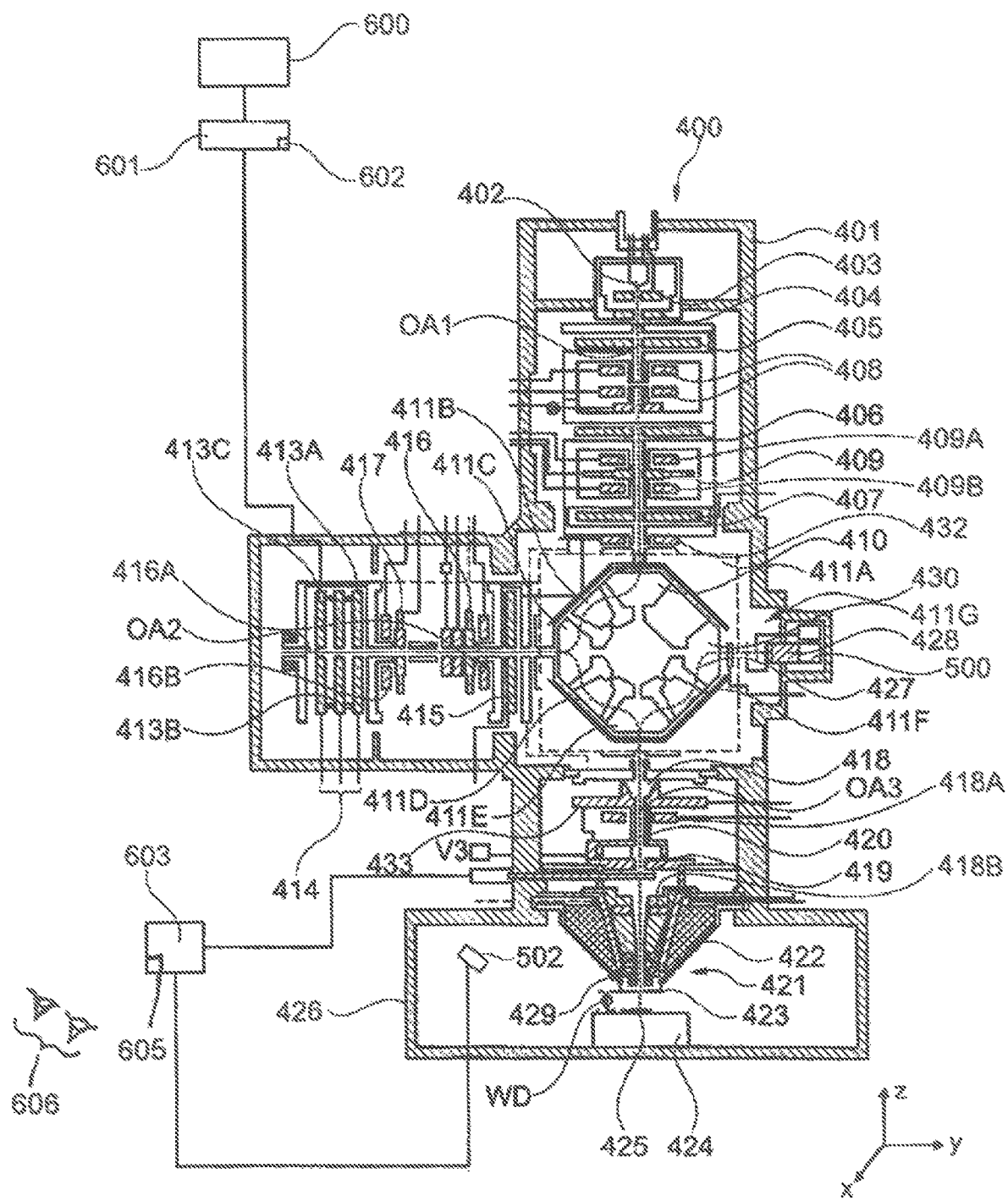
FIG. 3 shows a third embodiment of a particle beam device according to the system described herein.

FIG. 3 is a schematic illustration of a further illustrative embodiment of a particle beam device according to the system described herein. This illustrative embodiment of the particle beam device, identified by reference sign 400, may comprise a mirror corrector for correcting e.g. chromatic and/or spherical aberrations. The particle beam device 400 may comprise a particle beam column 401, which is embodied as an electron beam column and substantially corresponds to an electron beam column of a corrected SEM. However, the particle beam device 400 is not restricted to an SEM with a mirror corrector. Rather, the particle beam device may comprise any type of correction units.

The particle beam column 401 may comprise a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 due to a potential difference between the electron source 402 and the anode 404. Accordingly, a primary particle beam in the form of a primary electron beam is formed along a first optical axis OA1.

The primary particle beam is guided along a beam path, which corresponds to the first optical axis OA1, after the primary particle beam has emerged from the electron source 402. A first electrostatic lens 405, a second electrostatic lens 406, and a third electrostatic lens 407 may be used to guide the primary particle beam.

Furthermore, the primary particle beam is adjusted along the beam path using a beam guiding device. The beam guiding device of this illustrative embodiment may comprise a source setting unit with two magnetic deflection units 408 arranged along the first optical axis OA1. Moreover, the particle beam device 400 may comprise electrostatic beam deflection units. A first electrostatic beam deflection unit 409, which is also embodied as a quadrupole in a further illustrative embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B may be set for the purpose of setting the primary particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 is arranged at the entrance to the beam deflection device 410.

The beam deflection device 410 is used as a particle beam deflector, which deflects the primary particle beam in a specific manner. The beam deflection device 410 may comprise a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The primary particle beam enters the beam deflection device 410 along the first optical axis OA1 and it is deflected by the beam deflection device 410 in the direction of a second optical axis OA2. The beam deflection is performed using the first magnetic sector 411A, the second magnetic sector 411B and the third magnetic sector 411C through an angle of 30° to 120°. The second optical axis OA2 is aligned with the first optical axis OA1 at the same angle. The beam deflection device 410 also deflects the primary particle beam which is guided along the second optical axis OA2, to be precise in the direction of a third optical axis OA3. The beam deflection is performed by the third magnetic sector 411C, the fourth magnetic sector 411D, and the fifth magnetic sector 411E. In the illustrative embodiment in FIG. 3, the deflection with respect to the second optical axis OA2 and with respect to the third optical axis OA3 is accomplished by deflecting the primary particle beam at an angle of 90°. Hence, the third optical axis OA3 extends coaxially with respect to the first optical axis OA1. However, it should be noted that the particle beam device 400 according to the system described herein is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2.

After the primary particle beam has been deflected by the first magnetic sector 411A, the second magnetic sector 411B and the third magnetic sector 411C, the primary particle beam is guided along the second optical axis OA2. The primary particle beam is guided to an electrostatic mirror 414 and it extends on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the primary particle beam which are reflected back at the electrostatic mirror 414 once again extend along the second optical axis OA2 and re-enter the beam deflection device 410. Then, they are deflected to the third optical axis OA3 by the third magnetic sector 411C, the fourth magnetic sector 411D, and the fifth magnetic sector 411E.

The electrons of the primary particle beam emerge from the beam deflection device 410 and may be guided along the third optical axis OA3 to the object 425 which is intended to be examined. On the path to the object 425, the primary particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. Using the fifth electrostatic lens 418, the primary particle beam is decelerated or accelerated to an electric potential of the beam guiding tube 420.

Using the objective lens 421, the primary particle beam is focused in a focal plane in which the object 425 is arranged. The object 425 is arranged on a movable sample stage 424. The movable sample stage 424 is arranged in a sample chamber 426 of the particle beam device 400.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam device 400 are decelerated to a potential of the object 425 arranged on the sample stage 424. The objective lens 421 is not restricted to a combination of the magnetic lens 422 and the sixth electrostatic lens 423. Rather, the objective lens 421 may assume any suitable form. By way of example, the objective lens 421 may also be embodied as a purely magnetic lens or as a purely electrostatic lens.

The primary particle beam which is focused onto the object 425 interacts with the object 425, interaction particles emerging as a result thereof. In particular, secondary electrons are emitted from the object 425 or backscattered electrons are scattered back at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the primary particle beam in the opposite direction to the primary particle beam.

The particle beam device 400 may comprise a first detector 419 which is arranged between the beam deflection device 410 and the objective lens 421 along the beam path. Secondary electrons traveling in directions aligned at a large angle with respect to the third optical axis OA3 are detected by the first detector 419. The first detector 419 is connected to a display unit 603 via a processing unit (not shown).

Backscattered electrons and secondary electrons which have a small axial distance with respect to the third optical axis OA3 at the location of the first detector 419—i.e. backscattered electrons and secondary electrons which have a small distance from the third optical axis OA3 at the location of the first detector 419—enter the beam deflection device 410 and may be deflected to an analysis detector 428 of an analysis device 500 by the fifth magnetic sector 411E, the sixth magnetic sector 411F and the seventh magnetic sector 411G along a detection beam path 427. The analysis device 500 is also connected to the display unit 603 (not shown in FIG. 3).

The first detector 419 generates detection signals which are largely generated by emitted secondary electrons. The detection signals which are generated by the first detector 419 may be guided to the display unit 603 and used to obtain information about the properties of the interaction region of the focused primary particle beam with the object 425. In particular, the focused primary particle beam is scanned over the object 425 using a scanning device 429. Then, an image of the scanned region of the object 425 can be generated by the detection signals, which may be generated by the first detector 419, and it can be displayed on the display unit 603, for example a monitor.

The analysis device 500 may have a retarding field grid device 430 arranged upstream of the analysis detector 428. An image of the scanned region of the object 425 can be generated by the detection signals, which may be generated by the analysis device 500, and it can be displayed on the display unit 603.

A radiation detector 502 used to detect interaction radiation arising on account of an interaction between the primary particle beam and the object 425 is also arranged in the sample chamber 426. By way of example, the interaction radiation is, once again, X-ray radiation or cathodoluminescence. The radiation detector 502 is likewise connected to the display unit 603.

The sample stage 424 is movable in three directions arranged perpendicular to one another, namely in an x-direction, in a y-direction and in a z-direction. Additionally, the sample stage 424 may be rotated about a first axis of rotation and about a second axis of rotation arranged perpendicular to the first axis of rotation. It is possible to set the distance WD of the surface of the object 425 from the sixth electrostatic lens 423 using a movement of the sample stage 424 in the z-direction, which extends parallel to the optical axis OA3 or corresponds to the latter. This is the working distance. By way of example, it lies in the range from 0.3 mm to 20 mm or in the range from 0.5 mm to 12 mm, as in the embodiments described above. The range limits are included in the predeterminable range. It should be noted that the aforementioned distance values should be understood to be only illustrative and not restrictive. Rather, other values for the distance may also be selected.

The particle beam device 400 likewise may comprise a processor 600. A computer program product with a program code controlling the particle beam device 400 is loaded into said processor. This is discussed in more detail further below. The processor 600 is also connected to the control unit 601 in this illustrative embodiment, said control unit 601 comprising a memory unit 602. The control unit 601 serves to actuate at least one unit of the particle beam device 400, which units have been explained above in respect of the description of the particle beam device 400: the first electrostatic lens 405, the second electrostatic lens 406, the third electrostatic lens 407, the magnetic deflection unit 408, the first electrostatic beam deflection unit 409, the first multipole unit 409A, the second multi-pole unit 409B, the beam deflection device 410, the first magnetic sector 411A, the second magnetic sector 411B, the third magnetic sector 411C, the fourth magnetic sector 411D, the fifth magnetic sector 411E, the sixth magnetic sector 411F, the seventh magnetic sector 411G, the first mirror electrode 413A, the second mirror electrode 413B, the third mirror electrode 413C, the electrostatic mirror 414, the fourth electrostatic lens 415, the second electrostatic beam deflection unit 416, the third multi-pole unit 416A, the fourth multi-pole unit 416B, the third electrostatic beam deflection unit 417, the fifth electrostatic lens 418, the fifth multi-pole unit 418A, the sixth multi-pole unit 418B, the objective lens 421, the magnetic lens 422, the sixth electrostatic lens 423, the first detector 419, the analysis detector 428, the radiation detector 502 and the sample stage 424. For reasons of clarity, FIG. 3 only shows the third mirror electrode 413C being connected to the control unit 601.

The display unit 603 of the embodiment according to FIG. 3 also may comprise an eye tracker 605. As mentioned above, the eye tracker 605 is used for tracking at least one eye or both eyes 606 of a user of the particle beam device 400.

Now, illustrative embodiments of the method according to the system described herein, which may be used in the combination device 200 according to FIG. 2, will be described. It should be noted that the illustrative embodiments of the method according to the system described herein may also be used analogously in the SEM 100 according to FIGS. 1 and 1A and in the particle beam apparatus 400 according to FIG. 3.

Figure 4:
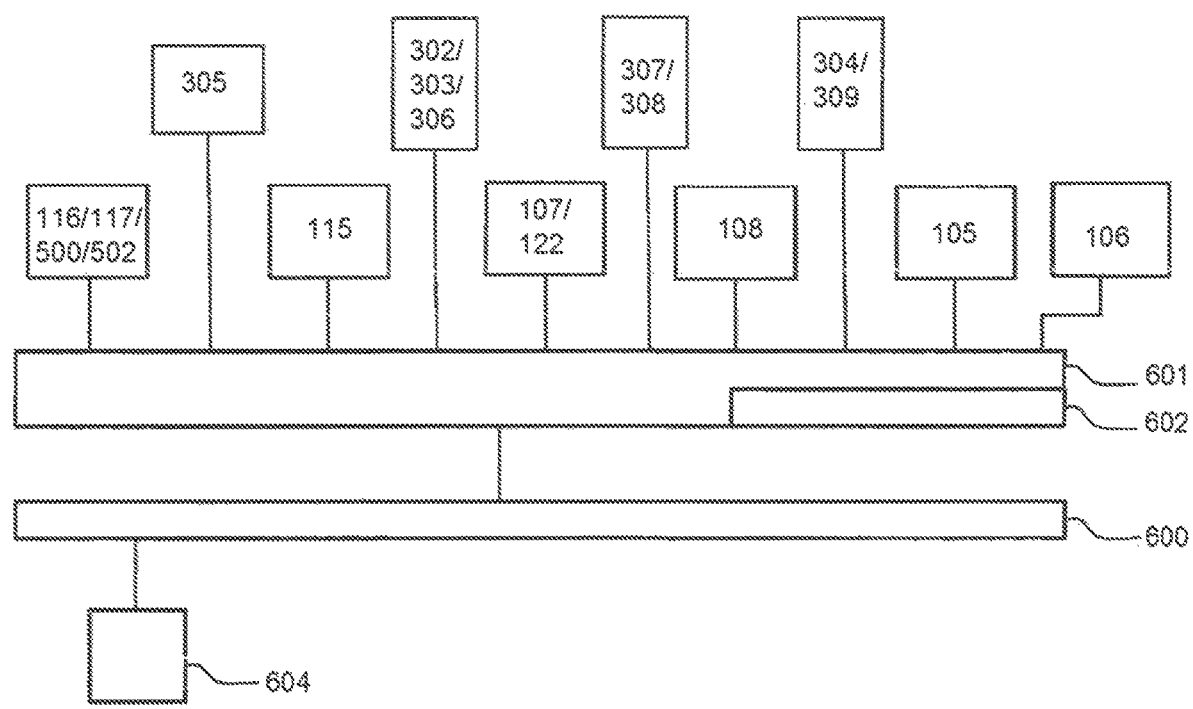
FIG. 4 shows a schematic illustration of units of the particle beam device according to FIG. 2, which units may be actuated by a control unit, according to an embodiment of the system described herein.

FIG. 4 shows a schematic illustration of the units of the combination device 200 which may be actuated by the control unit 601. The control unit 601, which may comprise the memory unit 602, may be connected to the processor 600. The processor 600, in turn, is connected to a fundamental parameter control unit 604. The fundamental parameter control unit 604 is used to set values of the landing energy of the electrons or the working distance WD.

It is explicitly mentioned that, additionally or alternatively, the SEM 100 and the ion beam device 300 of the combination device 200 may be controlled using separate control units, for example a first control unit for controlling the SEM 100 and a second control unit for controlling the ion beam device 300.

By way of example, the control unit 601 serves to set the contrast in the generated image using a first control parameter or set the brightness in the generated image using a second control parameter. By way of example, a gain factor of an amplifier of at least one of the following detectors is adjusted to this end: the first detector 116, the second detector 117, the analysis device 500 and the radiation detector 502. A voltage at the collector grid 501 of the analysis device 500 may also be set using the control unit 601.

Moreover, it is possible to actuate the scanning device 115 using the control unit 601. By way of example, the scanning speed, with which the primary electron beam may be scanned over the object 114, is set by actuating the scanning device 115 using a third control parameter.

The control device 601 also serves to actuate e.g. the first objective lens 107 using a fourth control parameter, with the objective lens 107 setting the focusing of the primary electron beam onto the object 114. Further, the control unit 601 may also be used to set the electrostatic and/or magnetic units of the SEM 100, for example the first deflection device 122. By way of example, the primary electron beam is centered in the first objective lens 107 by setting the first deflection device 122 using a fifth control parameter. Moreover, the first deflection device 122 may be actuated using a sixth control parameter in such a way that there is a "beam shift" in the SEM 100. Additionally, the first deflection device 122 may be actuated using a seventh control parameter in such a way that the primary electron beam is blanked out. In other words, the primary electron beam is deflected in such a way that the primary electron beam is not guided to the object 114.

Moreover, the control unit 601 also serves to set the position of a mechanically displaceable unit of the SEM 100 by means of an eighth control parameter. By way of example, the first aperture unit 108 has a mechanically displaceable embodiment.

Furthermore, the control unit 601 also serves to set the condenser lens 105 using a ninth control parameter and/or to set the stigmator 106 using a tenth control parameter. Additionally, the control unit 601 also serves to set the position of the sample stage 305 using an eleventh control parameter.

The control unit 601 also serves to set the extraction electrode 302 in the ion beam device 300 using a twelfth control parameter. Additionally, the control unit 601 serves to set the ion condenser lens 303 using a thirteenth control parameter. Furthermore, the control unit 601 serves to set the adjustable aperture 306 of the ion beam device 300 using a fourteenth control parameter.

The control unit 601 also serves to set the first electrode arrangement 307 using a fifteenth control parameter. Moreover, the control unit 601 also serves to set the second electrode arrangement 308 using a sixteenth control parameter.

Furthermore, the control unit 601 serves to set the second objective lens 304 using a seventeenth control parameter. Moreover, the control unit 601 serves to set the second deflection unit 309 using an eighteenth control parameter.

Figure 5:
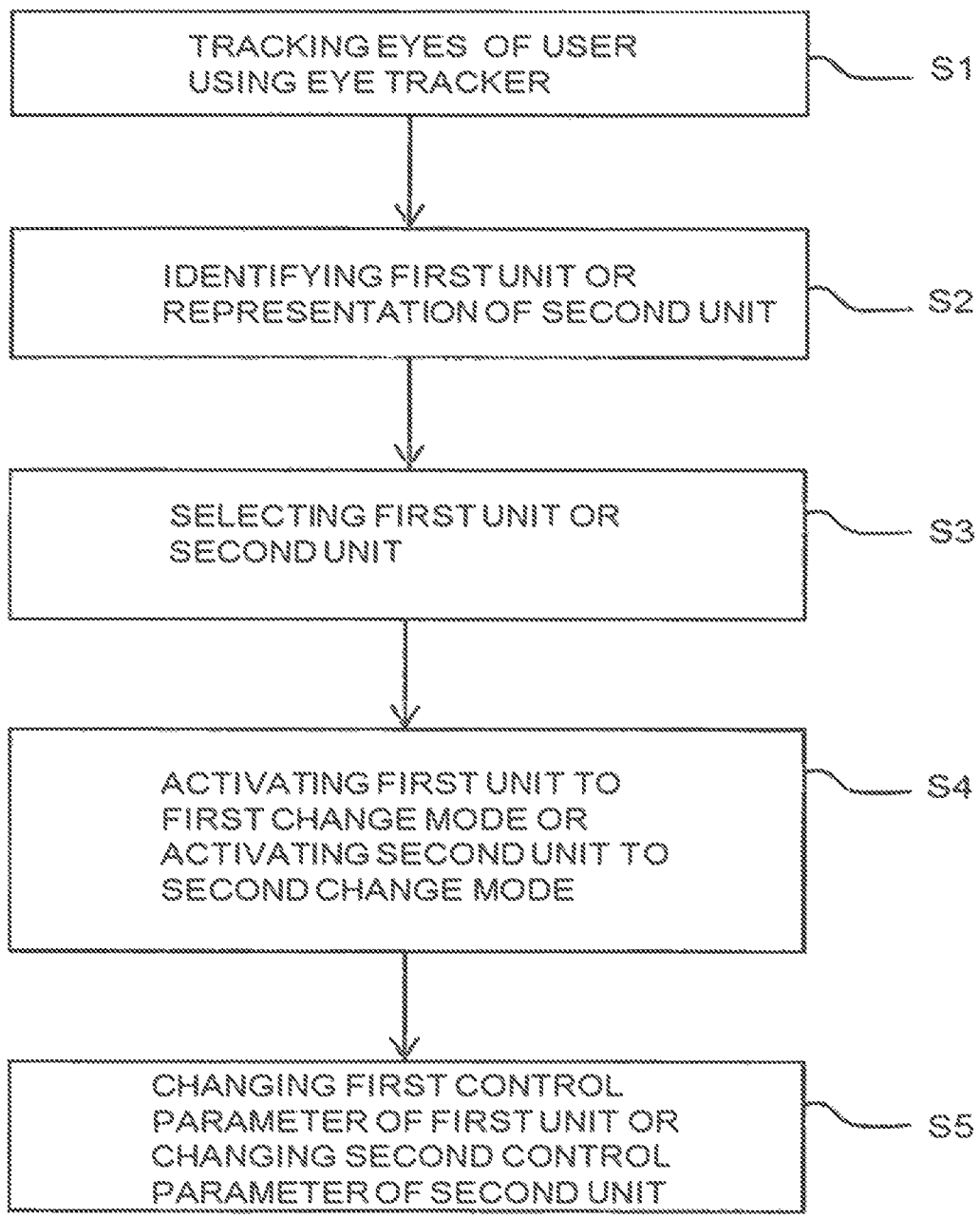
FIG. 5 shows a flowchart of a method for controlling a particle beam device, according to an embodiment of the system described herein.

FIG. 5 schematically shows a flow chart of an embodiment of the method according to the system described herein for the combination device 200. In method step S1, the eyes 606 of a user of the combination device 200 may be tracked using the eye tracker 605. In particular, the eye tracker 605 recognizes in what direction the eyes 606 of the user of the combination device 200 are directed. By tracking the eyes 606 of the user, it is possible to identify in method step S2, for example, (i) a first unit of the combination device 200 to which the eyes 606 of the user are directed or (ii) a representation to which the eyes 606 of the user are directed and which is shown, for example, on the display unit 603 of the combination device 200. The representation is associated with a second unit of the combination device 200.

The aforementioned first unit of the combination device 200 may be any adjustable and/or controllable component of the combination device 200, such as, for example, the first aperture unit 108, the condenser lens 105, the stigmator 106, the first detector 116, the second detector 117, the third detector 121, the analysis unit 500, the radiation detector 502, the first objective lens 107, the condenser lens 303, the second objective lens 304, the sample stage 305 and/or the adjustable aperture 306 of the combination device 200. The system described herein is not restricted to the aforementioned units as the first unit of the combination device 200. Rather, any component of the combination device 200 suitable to be used as a first unit may be used.

The aforementioned representation may be, for example, an image of the object 114 or of a unit of the combination device 200, for example generated by at least one of the above mentioned detectors. The image of the object 114 or of the unit of the combination device 200 is generated, for example, by the first detector 116, the second detector 117 and/or the analysis unit 500. The imaged unit of the combination device 200 is, for example, the sample stage 305 or a gas injection system (not shown in FIG. 2). The system described herein is not restricted to the aforementioned units of the combination device 200. Rather, any component of the combination device 200 suitable to be used as a unit of the combination device 200 may be used. Alternatively, the aforementioned representation may be, for example, a schematic drawing of a unit of the combination device 200

The aforementioned representation may also be, for example, analysis data generated by the radiation detector 502, for example an EDX detector or a WDX detector. When the representation is identified, the unit generating the representation and being associated to the representation is identified.

The embodiment of the method according to the system described herein also may comprise method step S3. Method step S3 may provide for selecting the first unit of the combination device 200 if the first unit of the combination device 200 has been identified. Alternatively, method step S3 may provide for selecting the second unit of the combination device 200 if the representation, for example shown on the display unit 603, has been identified.

In a further method step S4, the first unit of the combination device 200 is activated to a first change mode if the first unit of the combination device 200 has been selected. Alternatively, the second unit of the combination device 200 is activated to a second change mode if the second unit of the combination device 200 has been selected.

Moreover, in method step S5, at least one first control parameter of the first unit of the combination device 200 is changed if the first unit of the combination device 200 has been activated to the first change mode. Alternatively, at least one second control parameter of the second unit of the combination device 200 is changed if the second unit of the combination device 200 has been activated to the second change mode. As mentioned above, the first control parameter and the second control parameter may be physical variables, in particular a control current or a control voltage, but also e.g. the ratio of physical variables, in particular an amplification of physical variables. The values of the physical variables may be adjustable for example at the control unit 601 or the fundamental parameter control unit 604. The control unit 601 and the fundamental parameter control unit 604 feed the first and/or second unit(s) of the combination device 200 associated to the first and/or second control parameter(s), respectively, in such a way that desired physical effects, for example, the generation of specific magnetic fields and/or electrostatic fields or a desired position of a sample stage 305 are brought about.

Figure 6:
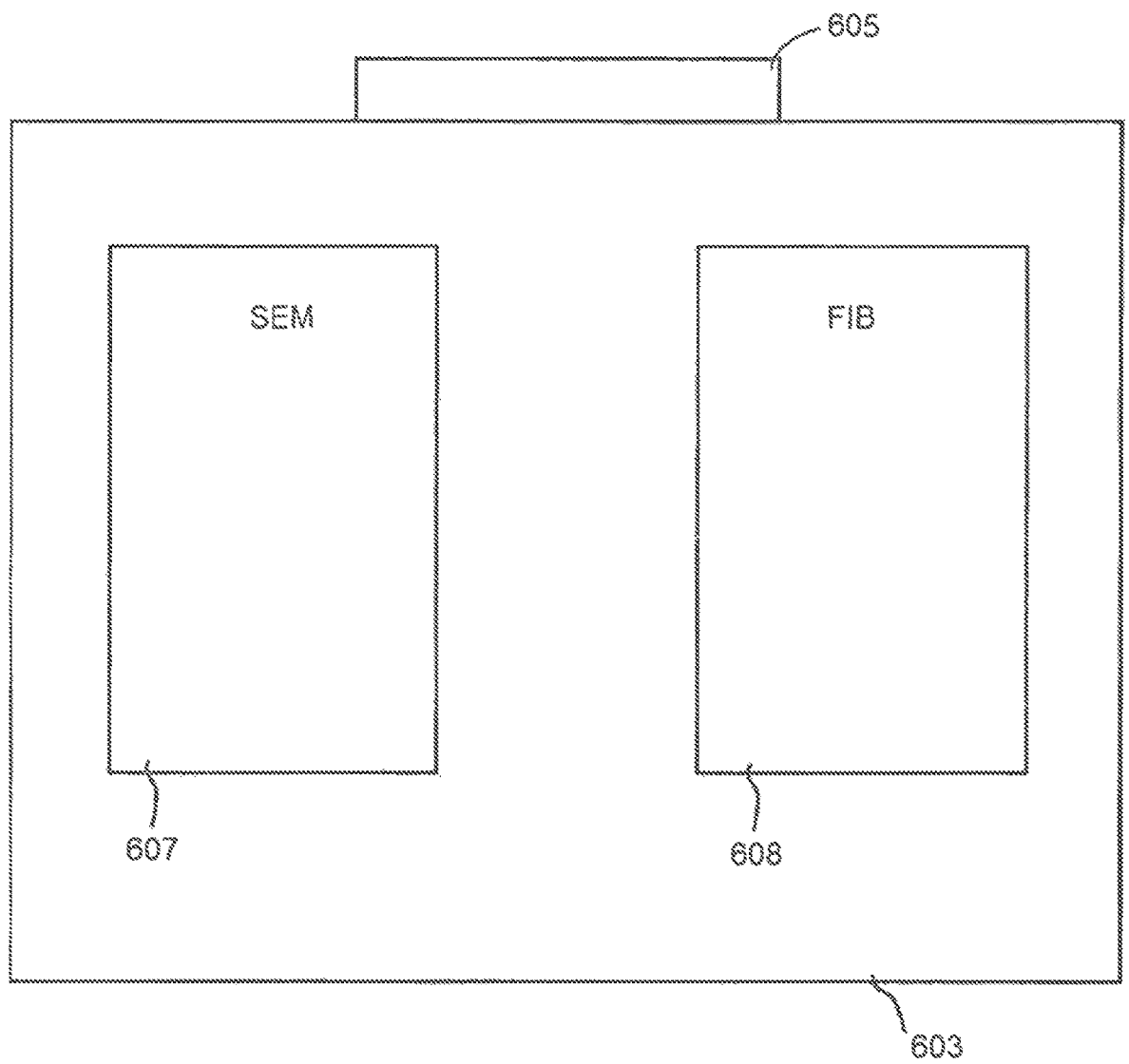
FIG. 6 shows a schematic illustration of a display unit of a particle beam device, wherein the display unit provides images of an object, according to an embodiment of the system described herein.

An embodiment of the method according to the system described herein is explained using FIG. 6. FIG. 6 schematically shows the display unit 603 comprising the eye tracker 605. The display unit 603 may provide two representations, namely a first image 607 of the object 114 generated by the SEM 100 and a second image 608 of the object 114 generated by the ion beam device 300. The first image 607 and the second image 608 may be provided, for example, using the first detector 116, the second detector 117 and/or the analysis unit 500. In this embodiment of the method according to the system described herein, the eyes 606 of the user of the combination device 200 may be tracked using the eye tracker 605. By tracking the user's eyes 606, it is identified whether the user is looking at the first image 607 or at the second image 608.

If it has been identified that the user is looking at the first image 607, the embodiment of the method according to the system described herein provides for selecting the first deflection unit 122. The first deflection unit 122 is activated to a change mode. A control parameter of the first deflection unit 122 is changed using the control unit 601 in such a way that the primary electron beam of the SEM 100 is deflected in the direction of the object 114 and is directed to the object 114 for generating interaction particles of the primary electron beam with the object 114. As mentioned above, the interaction particles are detected, for example, by the first detector 116, the second detector 117 and/or the analysis unit 500. The first detector 116, the second detector 117 and/or the analysis unit 500 generate detection signals used for generating further information which is shown in the first image 607. Moreover, when the user looks at the first image 607, the second deflection unit 309 of the ion beam device 300 may be operated in such a way that the second primary particle beam in the form of the ion beam is deflected such that the ion beam is not guided to the object 114. This deflection is also called blanking of the ion beam.

If it has been identified that the user is looking at the second image 608, the embodiment of the method according to the system described herein may provide for selecting the second deflection unit 309. The second deflection unit 309 is activated to a change mode. A control parameter of the second deflection unit 309 is changed using the control unit 601 in such a way that the ion beam generated by the ion beam device 200 is deflected in the direction of the object 114 and is directed to the object 114 for generating interaction of the ion beam with the object 114. Interaction particles such as secondary electrons may be detected using the first detector 116, the second detector 117 and/or the analysis unit 500 for generating detection signals used for generating further information which is shown in the second image 608. Moreover, material of the object 114 may be ablated or material is applied onto the object 114 using the ion beam and a gas injection system.

The aforementioned embodiment of the method according to the system described herein explained with respect to FIG. 6 has the advantage that the ion beam is directed to the object 114 only if the user is looking at the second image 608. Since the ion beam is used for ablating material of the object 114 or applying material to the object 114, no material is ablated or applied if the user is not monitoring the second image 608. This avoids unwanted ablation of the object 114 or applying of material to the object 114.

In a further embodiment of the method according to the system described herein, the first deflection unit 122 is also activated to a change mode in addition to the second deflection unit 309 being activated to a change mode as described above, if the user is looking at the second image 608. A control parameter of the first deflection unit 122 is changed using the control unit 601 in such a way that the primary electron beam of the SEM 100 is deflected away from the object 114 such that the primary electron beam of the SEM 100 does not impinge on the object 114. This avoids contamination of the object 114 by the primary electron beam of the SEM 100.

In a further embodiment of the method according to the system described herein, the primary electron beam of the SEM 100 and the ion beam of the ion beam device 300 may be reciprocally guided away from the object 114. This will avoid interaction of the primary electron beam of the SEM 100 with the ion beam of the ion beam device 300 as well as avoid generation of unwanted detector signals.

A further embodiment of the method according to the system described herein is explained using FIG. 6. As mentioned above, FIG. 6 schematically shows the display unit 603 comprising the eye tracker 605. The display unit 603 may provide two representations, namely the first image 607 of the object 114 generated by the SEM 100 and the second image 608 of the object 114 generated by the ion beam device 300. The first image 607 may be provided, for example, using the first detector 116. Moreover, the second image 608 may be provided using the analysis device 500. In this further embodiment of the method according to the system described herein, the eyes 606 of the user of the combination device 200 may be tracked using the eye tracker 605. By tracking the user's eyes 606, it is identified whether the user is looking at the first image 607 or at the second image 608. If the user is looking at the first image 607, the further embodiment of the method according to the system described herein may provide for selecting the first detector 116. The first detector 116 is activated to a first change mode. A control parameter of the first detector 116 is changed using the control unit 601. For example, a gain factor is set at an amplifier of the first detector 116 for changing the contrast in the first image 607. If the user looks at the second image 608, the further embodiment of the method according to the system described herein may provide for selecting the analysis device 500. The analysis device 500 is activated to a second change mode. A control parameter of the analysis device 500 is changed using the control unit 601. For example, a gain factor is set at an amplifier of the analysis device 500 for changing the contrast in the second image 608.

Figure 7:
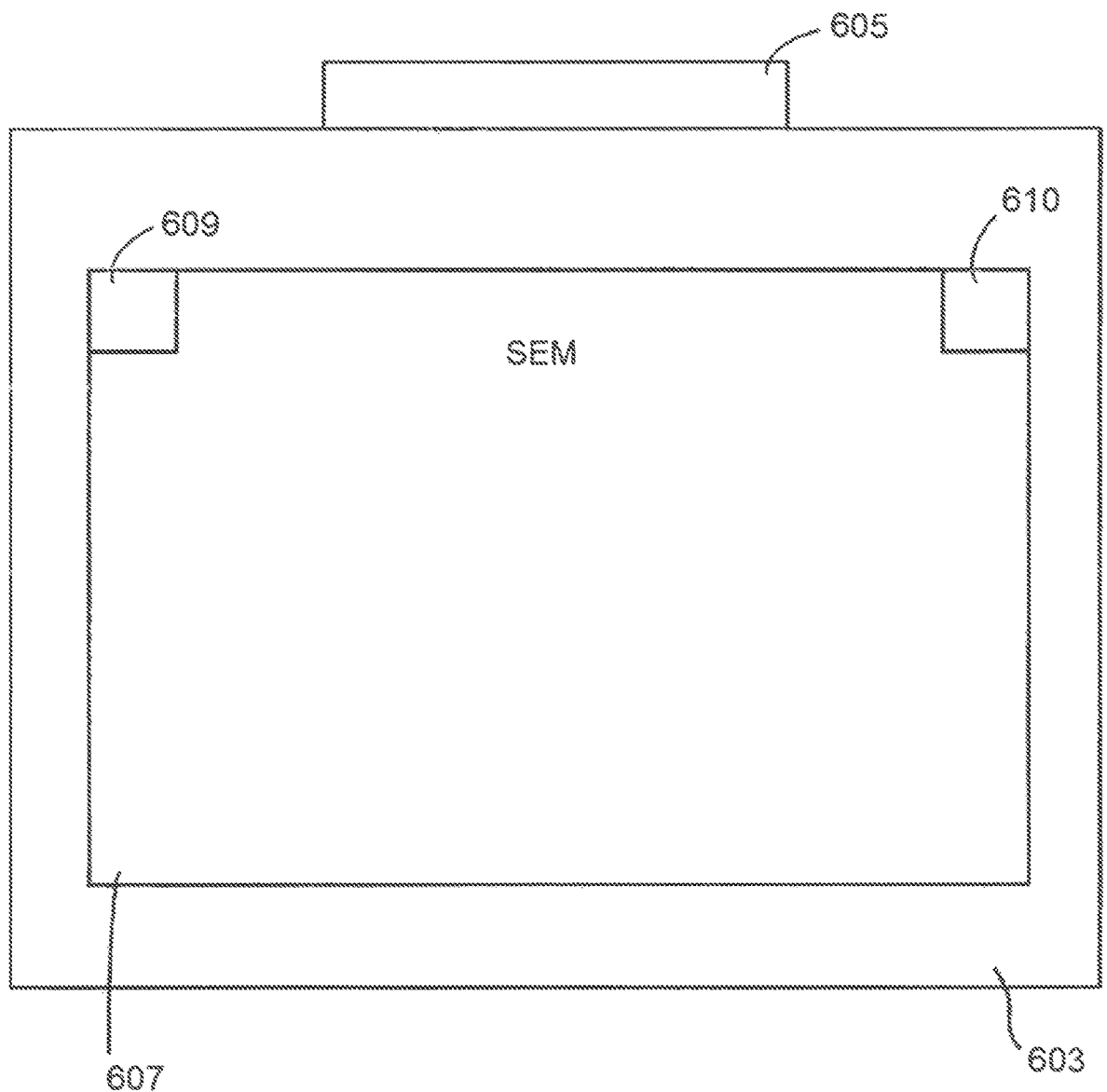
FIG. 7 shows a schematic illustration of a display unit of a particle beam device, wherein the display unit provides an image of an object, according to an embodiment of the system described herein.

Another embodiment of the method according to the system described herein is explained using FIG. 7. FIG. 7 schematically shows the display unit 603 comprising the eye tracker 605. The display unit 603 may provide the first image 607 of the object 114 generated by the SEM 100. The first image 607 may be provided, for example, using two detectors, namely the first detector 116 and the analysis unit 500. Therefore, the first image 607 is generated using detector signals of the first detector 116 and the analysis unit 500. The first image 607 may comprise two control fields, namely a first control field 609 associated to the first detector 116 and used for controlling the first detector 116 and a second control field 610 associated to the analysis unit 500 and used for controlling the analysis unit 500. In this embodiment of the method according to the system described herein, the user's eyes 606 may be tracked using the eye tracker 605. By tracking the user's eyes 606, it is identified whether the user is looking at the first control field 609 or the second control field 610. If the user is looking at the first control field 609, the embodiment of the method according to the system described herein may provide for selecting the first detector 116. The first detector 116 is activated to a first change mode. A control parameter of the first detector 116 is changed using the control unit 601. For example, a gain factor is set at an amplifier of the first detector 116 for changing the contrast in the first image 607. If the user is looking at the second control field 610, the embodiment of the method according to the system described herein may provide for selecting the analysis device 500. The analysis device 500 is activated to a second change mode. A control parameter of the analysis device 500 is changed using the control unit 601. For example, a gain factor is set at an amplifier of the analysis device 500 for changing the contrast in the first image 607.

Figure 8:
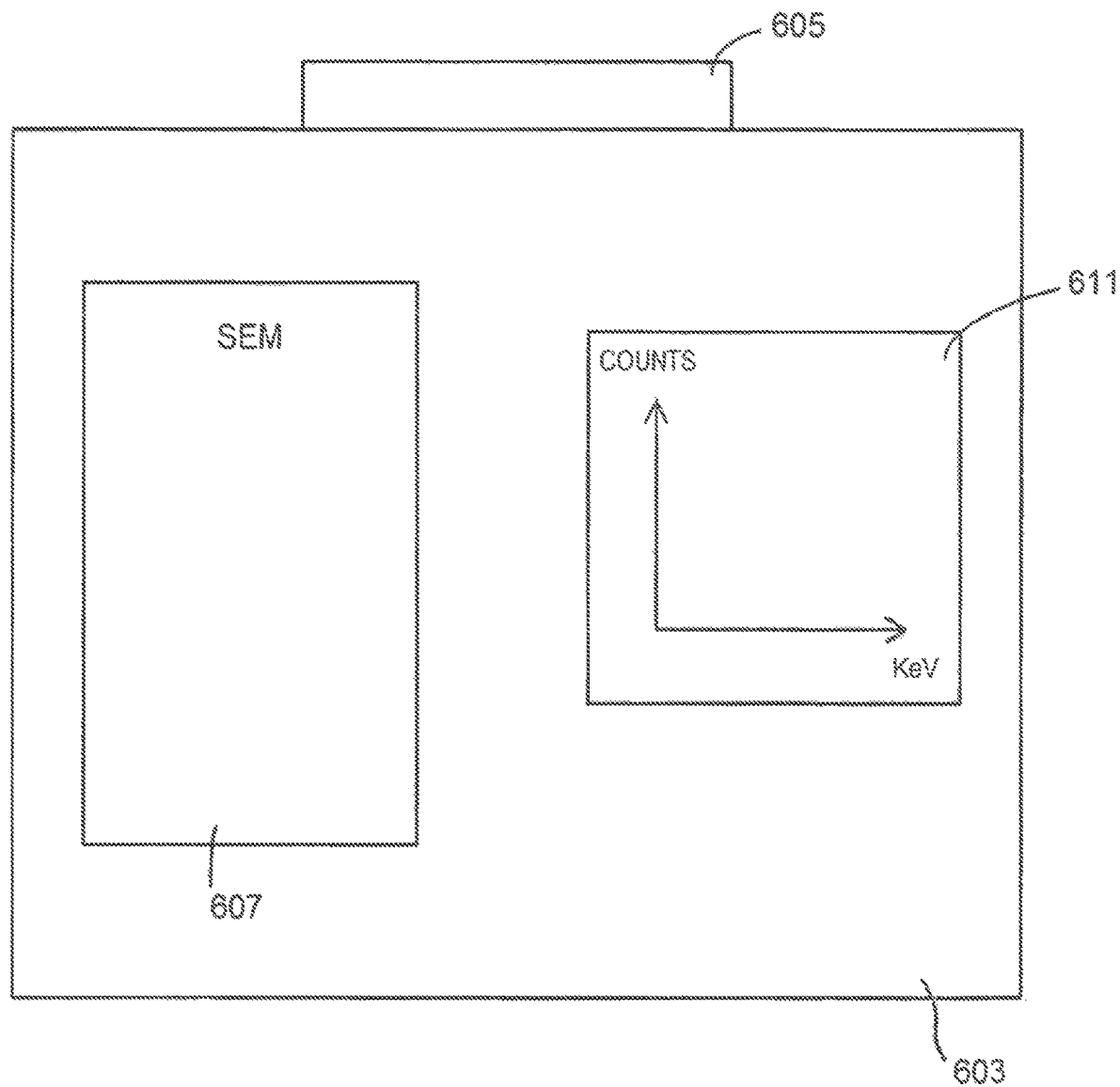
FIG. 8 shows a schematic illustration of a display unit of a particle beam device, wherein the display unit provides an image of an object and a representation of analysis data, according to an embodiment of the system described herein.

A further embodiment of the method according to the system described herein is explained using FIG. 8. FIG. 8 schematically shows the display unit 603 comprising the eye tracker 605. The display unit 603 may provide two representations generated by the SEM 100, namely a first image 607 of the object 114 generated by the SEM 100 and analysis data 611. The first image 607 may be provided, for example, using the second detector 117. The analysis data 611 may be provided by the radiation detector 502. As mentioned above, the radiation detector 502 detects interaction radiation arising on account of an interaction between the primary electron beam of the SEM 100 and the object 114. By way of example, the interaction radiation is X-ray radiation or cathodoluminescence. For example, the radiation detector 502 is an EDX detector. The analysis data 611 may comprise a graph representing counts in dependency of energy. In this further embodiment of the method according to the system described herein, the eyes 606 of the user of the combination device 200 may be tracked using the eye tracker 605. By tracking the user's eyes 606, it is identified whether the user is looking at the first image 607 or at the analysis data 611. If the user is looking at the first image 607, the embodiment of the method according to the system described herein may provide for selecting the second detector 117. The second detector 117 is activated to a first change mode. A control parameter of the second detector 117 is changed using the control unit 601. For example, a gain factor is set at an amplifier of the second detector 117 for changing the contrast in the first image 607. If the user is looking at the analysis data 611, the embodiment of the method according to the system described herein may provide for selecting the radiation detector 502. The radiation detector 502 is activated to a second change mode. A control parameter of the radiation detector 502 is changed using the control unit 601. For example, a gain factor is set at an amplifier of the radiation detector 502.

All embodiments of the method according to the system described herein provide for easy changing of values of control parameters associated to actuating units (components) of the particle beam device in the form of the combination device 200. Since recognition and identification of the control parameter to be changed is effected by visual contact of the user and, therefore, by intentionally selecting the control parameter to be changed, none of the embodiments of the method according to the system described herein is as error-prone as methods known from the prior art. In particular, the system described herein facilitates using a single control unit, for example, a slider or a joystick, for controlling at least two units of the combination device 200.

Various embodiments discussed herein may be combined with each other in appropriate combinations in connection with the system described herein. Additionally, in some instances, the order of steps in the flow diagrams, flowcharts and/or described flow processing may be modified where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the system described herein will be apparent to those skilled in the art from a consideration of the specification and/or an attempt to put into practice the system described herein disclosed herein. It is intended that the specification and examples be considered as illustrative only, with the true scope and spirit of the invention being indicated by the following claims.

The invention claimed is:

1. A method for controlling a particle beam device for imaging, analyzing and/or processing an object, comprising:
   identifying at least one control parameter of a unit of the particle beam device using an eye tracker by tracking at least one eye of a user of the particle beam device;
   changing the at least one control parameter of the unit of the particle beam device;
   providing a representation using signals of the unit of the particle beam device, the unit of the particle beam device being a detector of the particle beam device; and
   identifying the representation using the eye tracker, thereby identifying the at least one control parameter.

2. A method for controlling a particle beam device for imaging, analyzing and/or processing an object, comprising:
   identifying at least one control parameter of a unit of the particle beam device using an eye tracker by tracking at least one eye of a user of the particle beam device;
   changing the at least one control parameter of the unit of the particle beam device;
   providing a representation as an image generated by the unit of the particle beam device, the unit of the particle beam device being a detector of the particle beam device; and
   identifying the representation using the eye tracker, thereby identifying the at least one control parameter.

3. A method for controlling a particle beam device for imaging, analyzing and/or processing an object, comprising:
   identifying at least one control parameter of a unit of the particle beam device using an eye tracker by tracking at least one eye of a user of the particle beam device;
   changing the at least one control parameter of the unit of the particle beam device;
   providing a representation as an image of the unit of the particle beam device; and
   identifying the representation using the eye tracker, thereby identifying the at least one control parameter.

4. A method for controlling a particle beam device for imaging, analyzing and/or processing an object, comprising:
   identifying at least one control parameter of a unit of the particle beam device using an eye tracker by tracking at least one eye of a user of the particle beam device;
   changing the at least one control parameter of the unit of the particle beam device;
   providing a representation as an image of the object arranged at the unit of the particle beam device; and
   identifying the representation using the eye tracker, thereby identifying the at least one control parameter.

5. The method according to any of claims 1-4, wherein the method comprises one of the following steps:
   using an ion beam device as the particle beam device; and
   using an electron beam device as the particle beam device.

6. A method for controlling a particle beam device for imaging, analyzing and/or processing an object, comprising:
   tracking at least one eye of a user of the particle beam device using an eye tracker;
   identifying at least one of: (i) a first unit of the particle beam device to which the at least one eye of the user is directed and (ii) a representation to which the at least one eye of the user is directed, wherein the representation is associated with a second unit of the particle beam device;
   selecting the first unit of the particle beam device if the first unit of the particle beam device has been identified or selecting the second unit of the particle beam device if the representation has been identified; and
   activating the first unit of the particle beam device to a first change mode if the first unit of the particle beam device has been selected and changing at least one first control parameter of the first unit of the particle beam device, or
   activating the second unit of the particle beam device to a second change mode if the second unit of the particle beam device has been selected and changing at least one second control parameter of the second unit of the particle beam device.

7. The method according to claim 6, further comprising:
   providing the representation as data using signals of the second unit of the particle beam device, wherein the second unit of the particle beam device is a detector of the particle beam device.

8. The method according to claim 6, further comprising:
   providing the representation as an image generated by the second unit of the particle beam device, wherein the second unit of the particle beam device is a detector of the particle beam device.

9. The method according to claim 6, further comprising:
   providing the representation as an image of the second unit of the particle beam device.

10. The method according to claim 6, further comprising:
    providing the representation as an image of the object arranged at the second unit of the particle beam device.

11. The method according to claim 6, wherein the method comprises one of the following steps:
    (i) using an ion beam device as the particle beam device; and
    (ii) using an electron beam device as the particle beam device.

12. A computer program product comprising a program code which is loaded into a processor and which, when being executed, controls a particle beam device in such a way that a method is carried out, wherein the method comprises:
    tracking at least one eye of a user of the particle beam device using an eye tracker;
    identifying at least one of: (i) a first unit of the particle beam device to which the at least one eye of the user is directed and (ii) a representation to which the at least one eye of the user is directed, wherein the representation is associated with a second unit of the particle beam device;
    selecting the first unit of the particle beam device if the first unit of the particle beam device has been identified or selecting the second unit of the particle beam device if the representation has been identified; and
    activating the first unit of the particle beam device to a first change mode if the first unit of the particle beam device has been selected and changing at least one first control parameter of the first unit of the particle beam device, or activating the second unit of the particle beam device to a second change mode if the second unit of the particle beam device has been selected and changing at least one second control parameter of the second unit of the particle beam device.

13. A particle beam device for imaging, analyzing and/or processing an object, comprising:
(i) at least one particle beam generator for generating a primary particle beam having charged particles;
(ii) at least one objective lens for focusing the primary particle beam onto the object;
(iii) at least one detector for detecting interaction particles and/or interaction radiation, the interaction particles and the interaction radiation being generated when the primary particle beam impinges on the object; and
(iv) a processor into which a computer program product is loaded, which program, when being executed, controls a particle beam device in such a way that a method is carried out, wherein the method comprises:
tracking at least one eye of a user of the particle beam device using an eye tracker,
identifying at least one of: (i) a first unit of the particle beam device to which the at least one eye of the user is directed and (ii) a representation to which the at least one eye of the user is directed, wherein the representation is associated with a second unit of the particle beam device,
selecting the first unit of the particle beam device if the first unit of the particle beam device has been identified or selecting the second unit of the particle beam device if the representation has been identified, and
activating the first unit of the particle beam device to a first change mode if the first unit of the particle beam device has been selected and changing at least one first control parameter of the first unit of the particle beam device, or activating the second unit of the particle beam device to a second change mode if the second unit of the particle beam device has been selected and changing at least one second control parameter of the second unit of the particle beam device.

14. The particle beam device according to claim 13, wherein the particle beam generator is a first particle beam generator for generating a first primary particle beam having first charged particles,
wherein the objective lens is a first objective lens for focusing the first primary particle beam onto the object, and
wherein the particle beam device further comprises: a second particle beam generator for generating a second primary particle beam having second charged particles and a second objective lens for focusing the second primary particle beam onto the object.

15. The particle beam device according to claim 13, wherein the particle beam device is at least one of the following: an electron beam device and an ion beam device.

* * * * *